United States Patent
Kagaya et al.

(10) Patent No.: US 10,128,554 B2
(45) Date of Patent: Nov. 13, 2018

(54) PRINTED CIRCUIT BOARD, OPTICAL MODULE, AND TRANSMISSION EQUIPMENT

(71) Applicant: Oclaro Japan, Inc., Sagamihara, Kanagawa (JP)

(72) Inventors: Osamu Kagaya, Tokyo (JP); Koyu Takahashi, Kanagawa (JP)

(73) Assignee: Oclaro Japan, Inc., Kanagawa (JP)

( * ) Notice: Subject to any disclaimer, the term of this patent is extended or adjusted under 35 U.S.C. 154(b) by 62 days.

(21) Appl. No.: 15/460,546

(22) Filed: Mar. 16, 2017

(65) Prior Publication Data
US 2017/0271735 A1 Sep. 21, 2017

(30) Foreign Application Priority Data
Mar. 18, 2016 (JP) .................... 2016-055113

(51) Int. Cl.
| | |
|---|---|
| *H01J 40/14* | (2006.01) |
| *H01P 3/08* | (2006.01) |
| *G01J 1/44* | (2006.01) |
| *H05K 1/02* | (2006.01) |
| *H05K 1/11* | (2006.01) |
| *H05K 1/18* | (2006.01) |

(52) U.S. Cl.
CPC ............... *H01P 3/081* (2013.01); *G01J 1/44* (2013.01); *H05K 1/024* (2013.01); *H05K 1/0242* (2013.01); *H05K 1/115* (2013.01); *H05K 1/18* (2013.01); *H05K 2201/10121* (2013.01)

(58) Field of Classification Search
CPC ...... H05K 1/298; H05K 1/0274; H05K 1/028; H05K 1/115
USPC ............................... 250/214 R, 206; 398/182
See application file for complete search history.

(56) References Cited

U.S. PATENT DOCUMENTS

| | | | |
|---|---|---|---|
| 2014/0197899 A1 | 7/2014 | Kawai | |
| 2016/0095211 A1* | 3/2016 | Goto | .................... H05K 1/0274 398/135 |
| 2017/0331250 A1* | 11/2017 | Kagaya | ................... H01P 3/026 |

FOREIGN PATENT DOCUMENTS

| | | |
|---|---|---|
| JP | 2006-178209 A | 7/2006 |
| JP | 2011-066101 A | 3/2011 |
| JP | 2014-138015 A | 7/2014 |

* cited by examiner

*Primary Examiner* — Kevin Pyo
(74) *Attorney, Agent, or Firm* — Mattingly & Malur, PC

(57) ABSTRACT

A printed circuit board includes a first signal line inside a first dielectric layer; a first ground conductor layer and a second ground conductor layer; a second signal line disposed on the first ground conductor layer; a signal via for connecting the first signal line and the second signal line; and ground vias formed surrounding the signal via. The ground vias include first ground vias formed at respective first points, second ground vias formed at respective second points. The first points are placed on the line of a first polygon, and the second points are placed on the line of a second polygon, and the distances between adjacent first points and those between adjacent second points are all equal to or shorter than a first distance, and at least one second point is placed within the first distance from each of the adjacent first points.

18 Claims, 22 Drawing Sheets

PRINTED CIRCUIT BOARD, OPTICAL MODULE, AND TRANSMISSION EQUIPMENT

CROSS-REFERENCE TO RELATED APPLICATION

The present application claims priority from Japanese application JP 2016-055113, filed on Mar. 18, 2016, the content of which is hereby incorporated by reference into this application.

BACKGROUND OF THE INVENTION

1. Field of the Invention

The present invention relates to a printed circuit board, an optical module, and transmission equipment, and in particular, to reduction of crosstalk in a transmission line formed in a printed circuit board.

2. Description of the Related Art

A transmission line is formed in a printed circuit board, and an electronic signal (for example, a serial data signal) is transmitted through the transmission line. In the case where a plurality of transmission lines are disposed close to each other in a printed circuit board, deterioration in waveform quality of an electronic signal due to crosstalk is concerned. Crosstalk between transmission lines includes two types, namely, far-end crosstalk (FEXT (Far End Crosstalk), or Forward Crosstalk) and near-end crosstalk (NEXT: Near End Crosstalk, or Backward Crosstalk).

In the case where a plurality of transmission lines are disposed such that parts thereof are positioned close to and in parallel to each other, crosstalk increases when the parts are longer. Further, crosstalk increases with speeding up of an electronic signal (for example, as increase of the bit rate of a serial data signal).

SUMMARY OF THE INVENTION

With size reduction of a device mounting a printed circuit board, it is required to further reduce the width of the printed circuit board, and a need of disposing an increased number of transmission lines arises. In view of the above, a technique for reducing crosstalk in a transmission line is important.

One example of a transmission line is a microstrip line. A microstrip line has a structure including a planar ground conductor layer and a linear conductor disposed via a dielectric layer. Note here that being linear refers to a shape having a predetermined width and extending, and a linear conductor will be hereinafter referred to as a strip conductor. In the case of a plurality of transmission lines, a plurality of strip conductors are disposed. With microstrip lines, there is a problem that far-end crosstalk increases as the interval between adjacent strip conductors is shorter.

On the contrary, as a transmission line appropriate for high speed electronic signal transmission, a strip line is available, and it is known that a strip line is superior in reduction of crosstalk between adjacent transmission lines. A strip line has a structure including a strip conductor and two planar ground conductor layers disposed above and below the conductor, respectively, via a dielectric layer. With a strip line, it is theoretically possible to eliminate far-end crosstalk completely as crosstalk due to an electric field and crosstalk due to a magnetic field completely offset to each other. However, practically, far-end crosstalk is not thoroughly eliminated due to inconsistency in relative permittivity of the dielectric or an asymmetrical cross sectional shape of the conductor. Nevertheless, it is possible to significantly reduce crosstalk. A strip line is implemented using a printed circuit board on which a plurality of ground conductor layers are sequentially stacked via a dielectric layer. A strip conductor is disposed between two adjacent ground conductor layers, not on the surface of a printed circuit board.

As it is unnecessary to dispose a strip conductor of a transmission line on the surface of a printed circuit board in the case of a strip line, it is possible to ensure an empty area on the surface of the printed circuit board. Accordingly, it is possible to package various circuits on the area, and therefore it is possible to obtain a significant effect of improving the degree of freedom in designing in view of achieving high density packaging.

JP 2014-138015 A and JP 2011-066101 A disclose a plurality of transmission line structures each including a strip line as a structure for reducing crosstalk.

Specifically, JP 2014-138015 A discloses a structure in which a transmission line including a pair of strip lines for differential signals is formed to reduce crosstalk between differential signal vias that connect a plurality of wiring layers. A structure in which signal vias and ground vias are laid out at relatively high density is disclosed.

Meanwhile, JP 2011-066101 A discloses a line structure for reducing crosstalk between strip lines in the case where the strip lines are disposed in a space between vias arranged in a lattice at high density.

A strip line is a transmission line for transmitting an electromagnetic wave, and it is known that the mode of an electromagnetic wave transmitted is a TEM mode. Meanwhile, it is known that a space covered above and below thereof each by a conductor layer is a parallel plate waveguide, or a waveguide where an electromagnetic wave in the TE mode and the TM mode can be propagated. As means for blocking propagation of the TE mode and the TE mode, there is known a technique for periodically disposing many high dielectric posts or metal posts in the area space, or a technique for arranging in a 2D lattice. This structure is referred to also as a 2D photonic crystal.

JP 2006-178209 A discloses one example of 2D photonic crystal. The structure disclosed in JP 2006-178209 A includes a space defined by a dielectric sandwiched between the upper and lower conductor layers, where high dielectric posts are arranged in a hexagonal lattice or a square lattice to thereby ensure an area for blocking propagation of the TM mode. It is described that the pitch of the lattice is about 1.9 mm, and that the lattice area cuts off the TM mode with a frequency 29 GHz or less.

A case in which a part of a transmission line includes two electrically conducting planar layers and a strip conductor disposed inside a dielectric layer formed between the two electrically conducting planar layers and is formed in a printed circuit board is considered. This part of the transmission line is referred to as a first transmission line. The first transmission line is a strip line. Even in the case where the first transmission line is formed in a printed circuit substrate, in order to connect the first transmission line to an electronic component mounted on the surface of the printed circuit substrate or to other substrates, a second transmission line which is another transmission line may be formed in a surface layer of the printed circuit substrate, and an end portion of the first transmission line may be connected to an end portion of the second transmission line. In the above, "other substrates" may include a flexible printed circuit (FPC), for example, and the second transmission line may be formed using a microstrip line.

In this case, the first transmission line may be connected to the second transmission line via a via hole. An end portion of the strip conductor (disposed inside the printed circuit board) of the first transmission line is connected to an end portion of the strip conductor (disposed on the surface of the printed circuit board) of the second transmission line via a signal via. When the strip conductor of the first transmission line is made longer and the strip conductor of the second transmission line is made accordingly shorter, crosstalk can be reduced. Note that in the case where a transmission line for a transmitter channel and a transmission line for a receiver channel are disposed in the printed circuit board, it is desirable that a signal via for the transmitter channel and a signal via for the receiver channel are disposed apart from each other with the longest possible distance in-between. However, even though the transmission line is formed in such a structure, crosstalk will increase with speeding up of an electronic signal. In view of the above, reduction of crosstalk is a task to be accomplished.

The present invention has been conceived in view of the above, and aims to provide a printed circuit board, an optical module, and transmission equipment capable of reducing crosstalk in a transmission line.

(1) In order to achieve the above described object, a printed circuit board according to the present invention may include a first dielectric layer; a first signal line extending inside the first dielectric layer; a first ground conductor layer disposed on a front surface of the first dielectric layer and having a through hole; a second ground conductor layer disposed on a rear surface of the first dielectric layer; a second dielectric layer disposed on a side of the first ground conductor layer, opposite from the first signal line; a second signal line disposed on the side of the first ground conductor layer, opposite from the first signal line at least via the second dielectric layer; a signal via extending in the through hole, for electrically connecting the first signal line and the second signal line and for being electrically cut off from the first ground conductor layer; and a plurality of ground vias formed surrounding the signal via and extending through the first dielectric layer, for electrically connecting the first ground conductor layer and the second ground conductor layer, wherein the plurality of ground vias include a plurality of first ground vias formed at a plurality of respective first points, and a plurality of second ground vias formed at a plurality of respective second points, wherein the plurality of first points are placed on a line and at least at all respective vertexes of a first polygon in a plan view, the first polygon containing the signal via inside thereof, wherein the plurality of second points are placed on a line and at least at all respective vertexes of a second polygon in a plan view, the second polygon containing on or inside a side thereof, and wherein when it is assumed that, in a case the plurality of ground vias are arranged in an equilateral triangular lattice, an equilateral triangular lattice spacing with a frequency corresponding to an electronic signal transmitted as a cutoff frequency is defined as a first distance, distances between the respective adjacent first points among the plurality of first points are all equal to or shorter than the first distance, distances between the respective adjacent second points among the plurality of second points are all equal to or shorter than the first distance, at least one of the plurality of second points is placed within the first distance from each of the adjacent first points making a pair, no via connected to a potential other than a ground potential is formed in an area outside the signal via and inside the second polygon, and no ground via is formed outside the second polygon within the first distance from the second polygon.

(2) A printed circuit board according to the present invention may include a first dielectric layer; a first signal line extending inside the first dielectric layer; a first ground conductor layer disposed on a front surface of the first dielectric layer and having a through hole; a second ground conductor layer disposed on a rear surface of the first dielectric layer; a second dielectric layer disposed on a side of the first ground conductor layer, opposite from the first signal line; a second signal line disposed on the side of the first ground conductor layer, opposite from the first signal line at least via the second dielectric layer; a signal via extending in the through hole, for electrically connecting the first signal line and the second signal line and for being electrically cut off from the first ground conductor layer; and a plurality of ground vias formed surrounding the signal via and extending through the first dielectric layer, for electrically connecting the first ground conductor layer and the second ground conductor layer, wherein the plurality of ground vias include a plurality of first ground vias formed at a plurality of respective first points, and a plurality of second ground vias formed at a plurality of respective second points, wherein the plurality of first points are placed on a line and at least at all respective vertexes of a first rectangle in a plan view, the first rectangle containing the signal via inside thereof, wherein the plurality of second points are placed on a line and at least at all respective vertexes of a second rectangle, the second rectangle containing the first rectangle on or inside a side thereof, and wherein when it is assumed, in a case the plurality of ground vias are arranged in a square lattice, that an square lattice spacing with a frequency corresponding to an electronic signal transmitted as a cutoff frequency is defined as a second distance, distances between the respective adjacent first points among the plurality of first points are all equal to or shorter than the second distance, distances between the respective adjacent second points among the plurality of second points are all equal to or shorter than the second distance, at least one of the plurality of second points is placed within the second distance from each of the plurality of first points, and no via connected to a potential other than a ground potential is formed in an area outside the signal via and inside the second rectangle, and no ground via is formed outside the second rectangle within the second distance from the second rectangle.

(3) In the printed circuit board according to the above described (1), the plurality of first points and the plurality of second points may be placed at respective lattice points of an equilateral triangular lattice.

(4) In the printed circuit board according to the above described (1) or (2), the plurality of first points and the plurality of second points may be placed at respective lattice points of a square lattice.

(5) In the printed circuit board according to the above described (1), the first polygon may be inscribed in the second polygon.

(6) In the printed circuit board according to the above described (2), the first rectangle may be inscribed in the second rectangle.

(7) In the printed circuit board according to the above described (1), the first distance may be 1.0 mm.

(8) In the printed circuit board according to the above described (2), the second distance may be 0.9 mm.

(9) In the printed circuit board according to any of the above described (1) to (8), the first signal line may be bent relative to the direction in which the second signal line reaches the signal via so as to avoid the plurality of ground vias in a plan view.

(10) In the printed circuit board according to any of the above described (1) to (9), the first signal line may include a pair of first sub-signal lines, the second signal line may include a pair of second sub-signal lines, and the signal via may include a pair of sub-signal vias, in which one of the pair of sub-signal vias electrically connects one of the pair of first sub-signal lines and one of the pair of second sub-signal lines, and another one of the pair of sub-signal vias electrically connects another one of the pair of first sub-signal lines and another of the pair of second sub-signal lines.

(11) The printed circuit board according to any of the above described (1) to (10) may further include a plurality of transmission line structures each including the first signal line, the second signal line, the signal via, and the plurality of ground vias.

(12) An optical module according to the present invention may include the printed circuit board according to any of the above described (1) to (11); and an optical device electrically connected to the printed circuit board, for converting one of an optical signal and an electronic signal to another of the optical signal and the electronic signal.

(13) A transmission equipment according to the present invention may include the printed circuit board according to any of the above described (1) to (11).

According to the present invention, there are provided a printed circuit board, an optical module, a transmission equipment capable of reducing crosstalk in a transmission line.

DETAILED DESCRIPTION OF THE INVENTION

Figure 1:
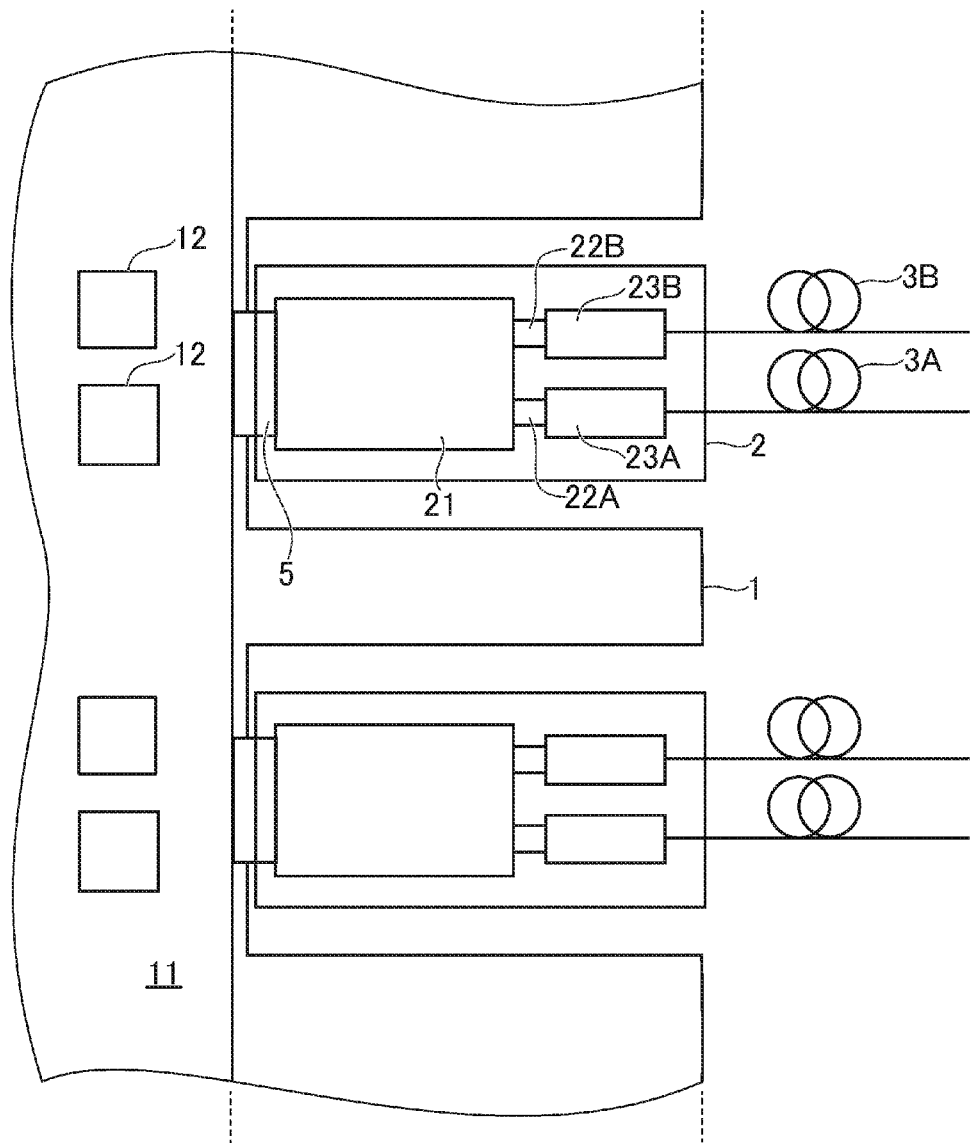
FIG. 1 is a schematic diagram showing a structure of transmission equipment and an optical module according to a first embodiment of the present invention.

In the following, embodiments of the present invention will be specifically described in detail, based on the attached drawings. Note that members having identical function are given the same reference numerals in all drawings referred to in description of the embodiments, and described only once. Also note that the attached drawings are to be referred to only to describe an example of an embodiment, and the respective sizes shown are not necessarily coincident with the scale mentioned in the description of the embodiments.

First Embodiment

FIG. 1 is a schematic diagram showing a structure of transmission equipment 1 and an optical module 2 according to a first embodiment of the present invention. The transmission equipment 1 has a printed circuit board 11. The optical module 2 also has a printed circuit board 21. A printed circuit board according to this embodiment is either or both of the printed circuit boards 11 and 21.

The transmission equipment 1 further has an IC 12. The transmission equipment 1 is a large-scale router or a switch, for example. The transmission equipment 1 has a function as an exchanger, for example, and is installed in a base station, etc. The transmission equipment 1 obtains receiver data (an electronic signal for receiver) from the optical module 2. The transmission equipment 1 determines, using the IC 12, etc., what data is to be sent to where, then generates transmitter data (an electronic signal for transmitter), and sends the data to the relevant optical module 2 via the printed circuit board 11.

The optical module 2 is a transceiver having a transmission function and a receiving function, and includes a ROSA (ROSA: Receiver Optical SubAssembly) 23A for converting an optical signal received via an optical fiber 3A into an electronic signal and a TOSA (TOSA: Transmitter Optical SubAssembly) 23B for converting an electronic signal into an optical signal. The printed circuit board 21, and the ROSA 23A and the TOSA 23B are connected respectively via flexible substrates 22A and 22B. Specifically, an electronic signal is sent from the ROSA 23A via the flexible substrate 22A to the printed circuit board 21, while an electronic signal is sent from the printed circuit board 21 via the flexible substrate 22B to the TOSA 23B. The optical module 2 and the transmission equipment 1 are connected via an electric connecter 5. Each of the ROSA 23A and TOSA 23A is an optical device electrically connected to the printed circuit board 21 and converts either one of an optical signal and an electronic signal to the other.

The transmission system according to this embodiment includes two or more transmission equipments 1, two or more optical modules 2, and one or more optical fibers 3. The one or more optical modules 2 are connected to each transmission equipment 1. The optical fiber 3 connects the optical modules 2 connected to two respective transmission equipments 1. One transmission equipment 1 generates transmission data, which is then converted into an optical single by the optical module 2 connected to the one transmission equipment 1 before being sent to the optical fiber 3. The optical signal is transmitted in the optical fiber 3, then received by the optical module 2 connected to another one transmission equipment 1, and converted into an electronic signal by the optical module 2 before being sent as receiver data to the another one transmission equipment 1.

In the above, the bit rate of an electronic signal transmitted/received by each optical module 2 is a class of 400 Gbit/s, and the optical module 2 is adapted to multi-channel scheme for eight channels for transmission and eight channels for receiving. The bit rate of an electronic signal transmitted in each channel is any between 50 Gbit/s and 56 Gbit/s.

Figure 2:
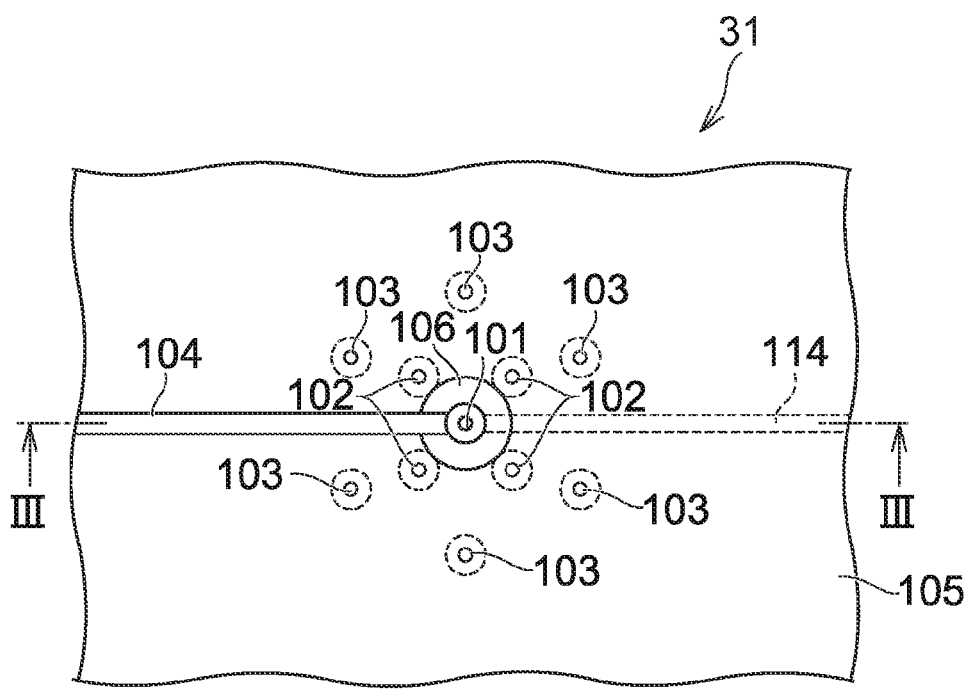
FIG. 2 is a schematic diagram showing a planer surface of a part of a printed circuit board according to the first embodiment of the present invention.
Figure 3:
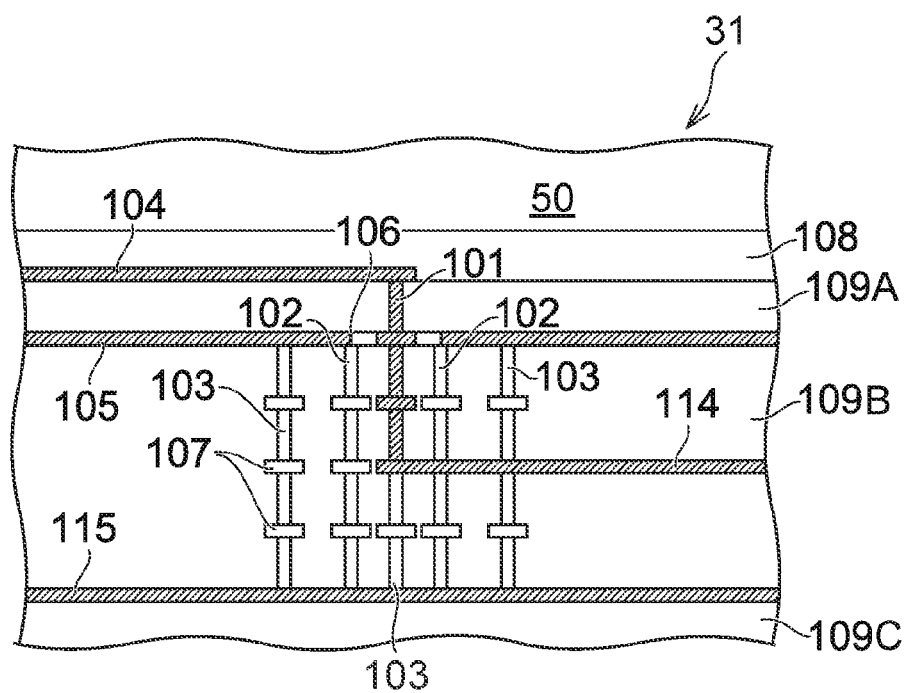
FIG. 3 is a schematic diagram showing a cross section of a part of a printed circuit board according to the first embodiment of the present invention.

FIG. 2 is a schematic diagram showing a planar surface of a part of a printed circuit board 31 according to this embodiment. FIG. 3 is a schematic diagram showing a cross section of a part of the printed circuit board 31 according to this embodiment. Specifically, FIG. 3 shows a cross section along the line III-III in FIG. 2. FIGS. 2 and 3 schematically show a planar surface and a cross section to help understanding of a structure of the printed circuit board 31, and are different from actual plan and cross sectional views.

The printed circuit board 31 according to this embodiment has a plurality of transmission lines for high speed digital signals. That is, the printed circuit board 31 has a plurality of channels. In FIGS. 2 and 3, one of the plurality of transmission lines is shown (one channel). The bit rate of an electronic signal transmitted is 56 Gbit/s. The transmission line includes a first transmission line and a second transmission line. As described above, the first transmission line is a strip line, and includes two planar conductor layers and a strip conductor disposed between the planar conductor layers. Meanwhile, the second transmission line is formed using a microstrip line, for example. Note that although the printed circuit board 31 is a printed circuit board 21 of the optical module 2 here, the printed circuit board 31 may be a printed circuit board 11 of the transmission equipment 1 instead, as described above.

The printed circuit board 31 is a printed wiring board having a multi-layer structure (fourteen layers, here) in which a plurality of conductor layers are formed each via a dielectric layer. To help understanding, in the cross section shown in FIG. 3, the scale in the height direction is eight times as large as that in the horizontal direction. In FIG. 3, only six upper layers of the fourteen layers are shown.

As shown in FIGS. 2 and 3, the printed circuit board 31 includes a signal via 101, a plurality of ground vias, two strip conductors 104, 114, and two ground conductor layers 105, 115. The printed circuit board 31 further includes a dielectric layer 109A formed between the ground conductor layer 105 and the strip conductor 104, a dielectric layer 109B formed between the two ground conductor layers 105, 115, and a dielectric layer 109C formed on the rear surface side of the ground conductor layer 115. Note here that the plurality of ground vias include a plurality of first ground vias 102 and a plurality of second ground vias 103. A cover lay 108 is disposed on the front surface of the printed circuit board 31 so as to cover the strip conductor 104.

The dielectric layer 109B is a first dielectric layer, and the dielectric layer 109A is a second dielectric layer. The strip conductor 114 is a first signal line, and runs inside the dielectric layer 109B. The ground conductor layer 105 is a first ground conductor layer, and disposed on the front surface of the dielectric layer 109B (on the upper surface in FIG. 3), and the dielectric layer 109A is disposed on the front surface of the ground conductor layer 105 (on the upper surface in FIG. 3). That is, the dielectric layer 109A is disposed on the surface of the ground conductor layer 105 on the opposite side from the strip conductor 114. The ground conductor layer 115 is a second ground conductor layer, and disposed on the rear surface of the dielectric layer 109B (on the lower surface in FIG. 3), that is, on the surface on the opposite side from the front surface. In other words, the dielectric layer 109B is disposed sandwiched between the rear surface of the ground conductor layer 105 and the front surface of the ground conductor layer 115.

Including the two ground conductor layers 105, 115 and the strip conductor 114 disposed between the ground conductor layers 105, 115, a first transmission line is constituted. The interval between the ground conductor layer 105 and the strip conductor 114 (the distance between the rear surface of the ground conductor layer 105 and the front surface of the strip conductor 114) is equal to the interval between the ground conductor layer 115 and the strip conductor 114 (the distance between the front surface of the ground conductor layer 115 and the rear surface of the strip conductor 114), and is 0.112 mm here. In other words, the thickness of a portion of the dielectric layer 109B positioned above the strip conductor 114 is equal to that of a portion of the same positioned below the strip conductor 114, and is 0.112 mm here. The width of the strip conductor 114 is 0.126 mm, and the thickness t of the same is 12 μm. These sizes are determined based on the characteristic impedance Zo of the first transmission line, in which the characteristic impedance Zo is 50 Ω here. According to electromagnetic field analysis, with these sizes, a value closer to the characteristic impedance Zo of the first transmission line is implemented.

Although having a through hole 106 formed at a position corresponding to one end of the strip conductor 114 in a plan view, the ground conductor layer 105 is a widely spreading planar layer except the through hole 106. The ground conductor layer 115 is a widely spreading planar layer.

However, in order to constitute the first transmission line, it is sufficient that the area where the ground conductor layers 105, 115 are disposed includes at least an area opposed to the strip conductor 114 and an area spreading outward from the area. Note that one end of the strip conductor 114 extends to the through hole 106 in a plan view.

The strip conductor 104 is a second signal line, and disposed on a side of the ground conductor layer 105, opposite from of the strip conductor 114. Specifically, the dielectric layer 109A is disposed on the front surface of the ground conductor layer 105 and the strip conductor 104 is disposed on the front surface of the dielectric layer 109A (the upper surface in FIG. 3). Note that one end of the strip conductor 104 extends to the through hole 106 in a plan view.

Including the ground conductor layer 105 and the strip conductor 104, a second transmission line is constituted. In order to constitute the second transmission line, it is sufficient that the area where the ground conductor layer 105 is disposed includes at least an area opposed to the strip conductor 104 and an area spreading outward from the area in a plan view. In the above, the interval (the thickness of the dielectric layer 109A) between the ground conductor layer 105 and the strip conductor 104 is 0.050 mm, the width of the strip conductor 104 is 0.16 mm, and the thickness t of the strip conductor 104 is 12 μm. The thickness of a portion of the cover lay 108, formed on the strip conductor 104 (the distance from the upper surface of the strip conductor 104 to the air 50) is 0.050 mm. These sizes are determined based on the characteristic impedance $Z_o$ of the second transmission line. The impedance of the second transmission line is generally equal to that of the first transmission line, and is 50Ω here. According to electromagnetic field analysis, with these sizes, a value close to the characteristic impedance $Z_o$ of the second transmission line is achieved.

Note that in the printed circuit board 31 according to this embodiment, the ground conductor layer included in the first transmission line and the ground conductor layer included in the second transmission line are formed using the same ground conductor layer (the ground conductor layer 105). The strip conductor 104 is disposed on the upper surface of the dielectric layer 109A disposed on the upper surface of the ground conductor layer 105. This however is not an exclusive example. That is, the ground conductor layer included in the first transmission line and the ground conductor layer included in the second transmission line may be formed using separate ground conductor layers, and it is sufficient that the second signal line is disposed on the side of the first ground conductor layer, opposite from the first signal line at least via the second dielectric layer.

The signal via 101 is a via hole extending through the through hole 106, and metal coating is applied to the inside wall of the via hole to electrically connect the strip conductor 114 and the strip conductor 104. The through hole 106 that is formed in the ground conductor layer 105 so as to encircle the signal via 101 is referred to also as a clearance hole. As dielectric is filled in the space between the signal via 101 and the through hole 106, the signal via 101 is electrically shielded from the ground conductor layer 105. Note that the clearance hole may be referred to also as an anti-pad. The diameter of the through hole 106 is 0.70 mm, for example.

A plurality of ground vias are formed surrounding the signal via 101 and penetrate the dielectric layer 109B to electrically connect the ground conductor layer 105 and the ground conductor layer 115. As described above, the plurality of ground vias include the plurality of first ground vias 102 (a first ground via group) and the plurality of second ground vias 103 (a second ground via group).

Figure 4:
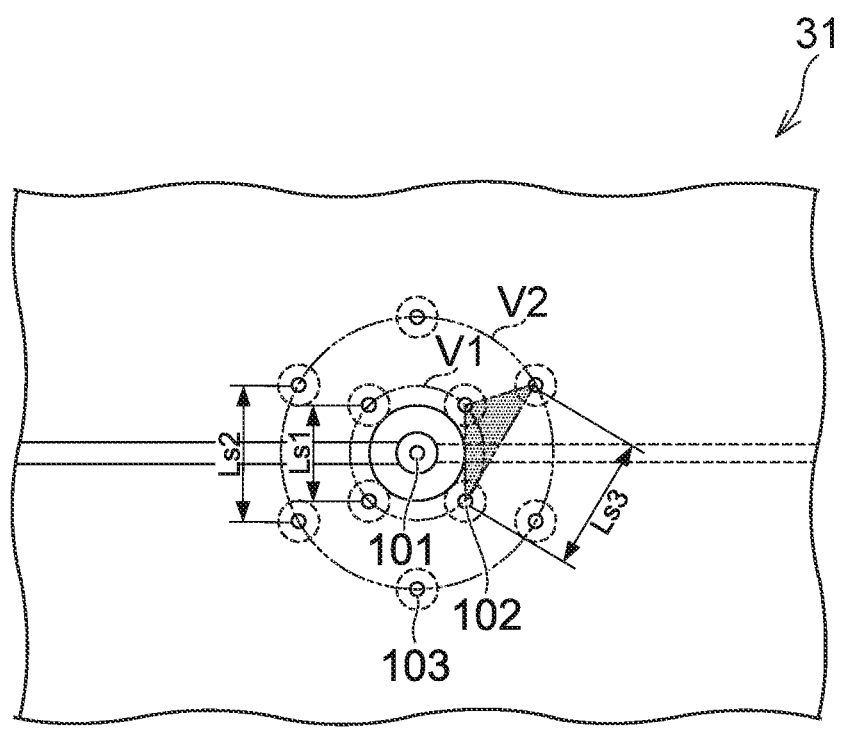
FIG. 4 is a schematic diagram showing a layout of a plurality of ground vias according to the first embodiment of the present invention.

FIG. 4 is a schematic diagram showing a layout of the plurality of ground vias according to this embodiment. The plurality of first ground vias 102 (the first ground via group: V1) are formed at a plurality of respective first points. Specifically, as shown in FIG. 4, four first points are arranged at equal intervals in the vicinity of the signal via 101 so as to surround the signal via 101, and a square is resulted when the adjacent first points are connected. The maximum value of the distance between the adjacent first points is defined as Ls1. As the distances between the respective adjacent first points are equal intervals, the distance Ls1 takes the value of this equal interval. Each first ground via 102 is formed at a position including a relevant first point, ideally, such that the first point falls on the center of the first ground via 102. The signal via 101 and the plurality of first ground vias 102 (the first ground via group) are formed at a connection portion between the first transmission line and the second transmission line, and a transmission line (a third transmission line) that simulates a coaxial line is formed, including the signal via 101 and the plurality of first ground vias 102. The transmission line further includes the third transmission line. Including the first transmission line, the second transmission line, and the third transmission line that connects the first transmission line and the second transmission line, a high speed digital channel (a transmission line) is constituted.

The plurality of first points where the plurality of respective first ground vias 102 are formed are positioned on the line of a first polygon in a plan view, and are positioned at least at all vertexes of the first polygon. The first polygon contains the signal via 101 inside thereof. The first polygon is a square here, and the plurality of first points are four first points placed at the respective vertexes of the square. In other words, no first point is placed on the line of the square except at the vertexes, that is, no first point is placed on a side of the square. However, an additional first point may be placed on a side of the square in addition to those placed at the vertexes (the four vertexes) of the square.

The plurality of second ground vias 103 (the second ground via group: V2) are formed at a plurality of respective second points. Surrounding the plurality of first ground vias 102 (the first ground via group), six second points are arranged at equal intervals. A regular hexagon is resulted when the adjacent second points are connected to each other. The maximum value of the distance between adjacent second points is defined as Ls2. As the distances between the respective adjacent second points are equal intervals, the distance Ls2 takes the value of this equal interval. Each second ground via 103 is formed at a positon including a relevant second point, ideally, such that the second point falls on the center of the relevant second ground via 103.

The plurality of second points where the plurality of respective second ground vias 103 are formed are positioned on the line of a second polygon in a plan view, and are positioned at least at all vertexes. The second polygon contains the first polygon on or inside a side thereof. Here, the second polygon contains the first polygon inside a side thereof. The second polygon is a regular hexagon, and the plurality of second points are six second points placed at the respective vertexes of the regular hexagon. In other words, no second point is placed on the line of the regular hexagon except at the vertexes, that is, no second point is placed on a side of the regular hexagon. However, an additional second point may be placed on a side of the regular hexagon in addition to those placed at the vertexes (the six vertexes) of the regular hexagon.

In this specification, "the second polygon contains the first polygon on or inside aside thereof" refers to the following two cases. In a first case, the first polygon is positioned so as to be contained inside the second polygon without touching any side of the second polygon. This embodiment belongs to this case. Meanwhile, in a second case, one or more vertexes of the first polygon are positioned on a side (except a vertex) of the second polygon, and the first polygon is fully contained inside the second polygon. The second case includes a case where the respective vertexes of the first polygon are positioned on a side (except a vertex) of the second polygon, that is, a case where the first polygon is inscribed in the second polygon.

In this embodiment, as the plurality of ground vias are laid out as shown in FIGS. 2 and 4, the second signal line (the strip conductor 104), the signal via 101, and the first signal line (the strip conductor 114) can be positioned on a single straight line. The first signal line starts extending from the signal via along the direction in which the second signal line reaches the signal via. The first signal line extends along that direction toward outside the plurality of ground vias (outside the second polygon) without overlapping the plurality of ground vias. In this embodiment, no ground via is formed outside the plurality of ground vias, which significantly improves the degree of freedom in designing the first signal line.

Characteristics of a printed circuit board according to this embodiment lie in the layout of the plurality of first points and the plurality of second points. Specifically, the first characteristic lies in that the distances between the respective adjacent first points are all equal to or shorter than the first distance. In this embodiment, the plurality of first points are arranged at equal intervals, and the distances between the respective adjacent first points are all equal to the distance Ls1, in which the distance Ls1 is 0.707 mm here. Note that the first distance (L1) is 1.0 mm here, of which details will be described later.

The second characteristic lies in that the distances between the respective adjacent second points are all equal to or shorter than the first distance. In this embodiment, the plurality of second points are laid out at equal intervals, and the distances between the respective adjacent second points are all equal to the distance Ls2, in which the distance Ls2 is 1.0 mm here.

The third characteristic lies in that at least one of the plurality of second points is placed within the first distance from any one pair of adjacent first points. As to a triangle defined by one pair of adjacent first points and a second point nearby, the maximum length of the side connecting the first point and the second point is defined as a distance Ls3. In this embodiment, a triangle including a side having a length equal to the distance Ls3 is the triangle shown shaded in FIG. 4, in which the distance Ls3 is 0.995 mm. That is, the distances Ls1, Ls2, Ls3 are all equal to or shorter than 1.0 mm, or the first distance (L1). That is, the distances Ls1, Ls2, Ls3 are all equal to or shorter than 1.0 mm.

The fourth characteristic lies in that no via connected to a potential other than a ground potential is formed in an area outside the signal via and inside the second polygon, and that no ground via is formed outside the second polygon within the first distance from the second polygon. It is preferable that no ground via is formed outside the second polygon. In the case where it is necessary to form a ground via for any need, a ground via is formed away from the second polygon by the first distance or longer. In the case where a ground via is formed outside and away from the second polygon by the first distance or longer, the placement density of the ground vias may be set lower than that of the plurality of first ground vias (the first ground via group) and that of the plurality of second ground vias (the second ground via group), and the via pitch between the adjacent ground vias may be set in excess of the first distance (L1).

Below, details of a structure of the printed circuit board 31 according to this embodiment will be described. As described above, the printed circuit board 31 has a plurality of high speed digital signal transmission lines, and the bit rate of an electronic signal transmitted is 56 Gbit/s. Through a build-up process, for example, wiring layers, such as a strip conductor, a ground conductor layer, etc., are formed by means of patterning, and a dielectric layer is stacked thereon. By repeating this process, the printed circuit board 31 is formed.

Copper foil is used for the strip conductors 104, 114 and the ground conductor layers 105, 115. Any of the materials made from glass fabric board material and epoxy resin (glass epoxy resin), liquid crystal polymer (LCP), and fluorine-based resin (polytetrafluoroethylene (PTFE)), etc., is used for the dielectric layers 109A, 109B, 109C. The relative permittivity of the dielectric layers 109A, 109B, 109C is 3.0, for example.

The cover lay 108 is a protection film made from dielectric, of which relative permittivity is 3.0, for example. The cover lay 108 prevents the printed circuit board 31 from being exposed to outside environment (for example, the air 50). A dielectric film for preventing solder adhesion, referred to as a solder resist layer, may be used instead of the cover lay 108.

Preferably, a laser via (LVH) is used for the signal via 101 and the plurality of ground vias (the first ground via 102 and the second ground via 103). The via diameter is 0.1 mm, for example. Each of the signal via 101 and the plurality of ground vias includes a plurality of lands 107 formed along the stacking direction. The land 107 is a part of a conductor pattern formed in a conductor layer, and is a conductor layer for relaying to a wiring layer, in a laser via extending in the stacking direction. The land 107 has a circle shape here, of which diameter is 0.3 mm, for example. The land 107 is formed in the connection portion between the strip conductor 104 and the signal via 101 and that between the strip conductor 114 and the signal via 101, in particular, in order to ensure sufficient electric connection. The copper foil pattered includes a portion for the strip conductor 104 (114) and a portion for the land 107, and one end of the strip conductor 104 (114) is connected to the land 107. Or, one end of the strip conductor 104 (114) may be the land 107. In the above, details of a structure of the printed circuit board 31 according to this embodiment have been described.

Below, the first distance will be described. The first distance serves as a reference value for defining the layout of the plurality of ground vias according to the present invention. The first distance is an equilateral triangular lattice spacing with a frequency corresponding to an electronic signal transmitted as a cutoff frequency in the case where a plurality of ground vias are arranged in an equilateral triangular lattice to ensure electric connection between a first ground conductor layer and a second ground conductor layer. That is, the first distance is a distance with a frequency corresponding to an electronic signal transmitted in the transmission line as a cutoff frequency in a periodic structure in which a plurality of ground vias are arranged in an equilateral triangular lattice. Note here that the cutoff frequency is defined as the highest frequency for cutting off an electromagnetic wave in the TE mode and the TM mode. For the printed circuit board 31 according to this embodiment, the bit rate of an electronic signal transmitted in each channel is any between 50 Gbit/s and 56 Gbit/s, and the cutoff frequency is set to 56 GHz so as to be adapted to such a bit rate band. That is, a frequency corresponding to an electronic signal transmitted in the transmission line is 56 GHz.

Figure 5:
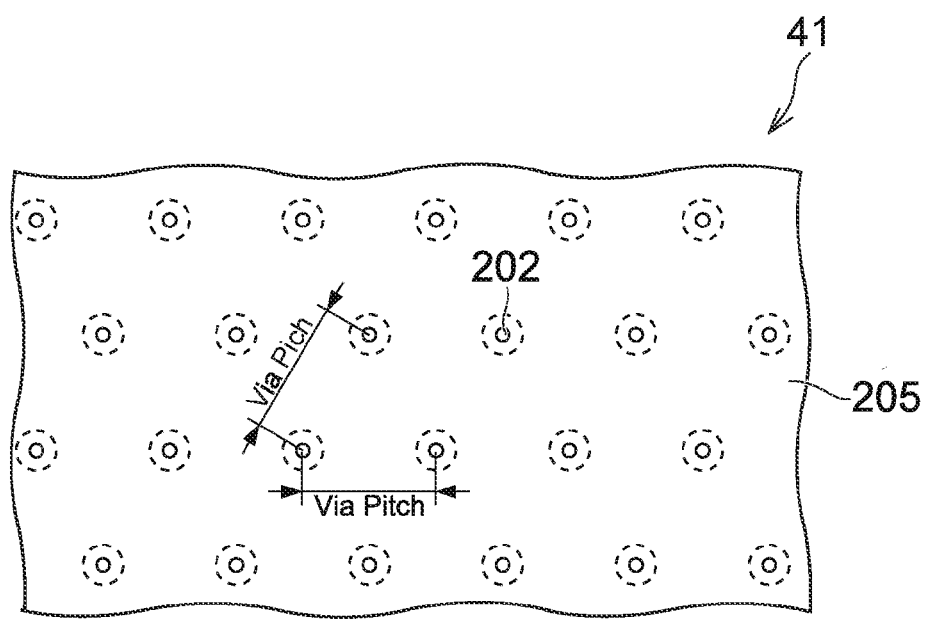
FIG. 5 is a schematic diagram showing a periodic structure in which ground vias are arranged in an equilateral triangular lattice.

FIG. 5 is a schematic diagram showing a periodic structure in which the ground vias are arranged in an equilateral triangular lattice. A printed circuit board 41 shown in FIG. 5 includes a transmission line similar to the first transmission line according to this embodiment, in which the transmission line of the printed circuit board 41 has the same size as that of the first transmission line according to this embodiment. In FIG. 5, an upper ground conductor layer 205 of the two ground conductor layers is shown. A plurality of ground vias 202 for connecting the two ground conductor layers are arranged in an equilateral triangular lattice at equal intervals. As described above, a cross sectional structure of the transmission line and the thickness of each layer are the same as those of the first transmission line according to this embodiment. Assume that the two ground conductor layers are sufficiently or infinitely wide, and that the periodic structure of the plurality of ground vias 202 sufficiently or infinitely continues. The periodic structure of the plurality of ground vias 202 is a 2D lattice structure referred to as an equilateral triangular lattice or a hexagonal lattice. An electromagnetic wave in the TE mode and TM mode that can be present in the area sandwiched by these two ground conductor layers can be relatively readily and accurately calculated, using an electromagnetic field analysis tool. While changing the distance between the centers of adjacent ground vias 202, that is, a via pitch, the lowest frequency at which an electromagnetic wave in the TE mode and the TM mode can be present, that is, a cutoff frequency of an electromagnetic wave in the TE and TM modes, is calculated.

Figure 6:
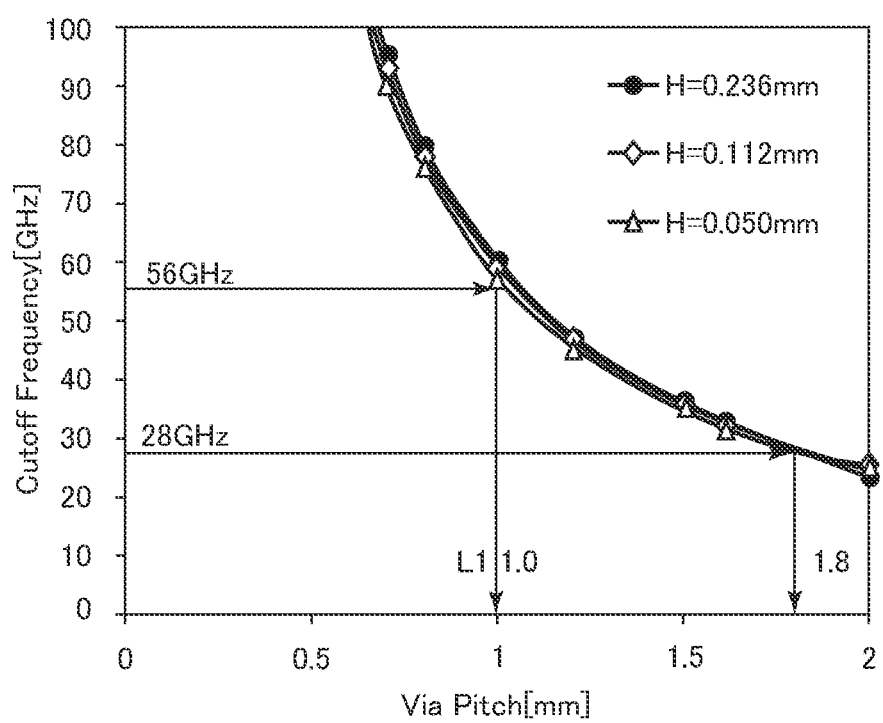
FIG. 6 shows a result of calculation of a cutoff frequency relative to a via pitch of the periodic structure shown in FIG. 5.

FIG. 6 shows a result of calculation of a cutoff frequency relative to a via pitch of the periodic structure shown in FIG. 5. In FIG. 6, not only the case in which the intervals between the strip conductor and the upper and lower respective ground conductor layers (the thickness of the dielectric layer) are 0.112 mm, similar to the first transmission line according to this embodiment, but also a case in which the interval is about ½ times (0.050 mm) as long as that interval, and a case in which the interval is about two times (0.236 mm) as long as that interval are plotted. As the via pitch of the adjacent ground vias 202 is made shorter, the cutoff frequency exhibits a sharp increase.

Meanwhile, when the thickness of the dielectric layer is changed in the range between a half and two times thereof, change in the cutoff frequency is very small. The bit rate of a digital modulation signal is defined as F. The bit rate is 56 Gbit/s here. In an area where the dielectric layer is sandwiched by two ground conductor layers, it is desired that an electromagnetic wave in the TE mode and the TM mode is cut off in the frequency range from 0 to F.

It is possible to obtain, from FIG. 6, a via pitch of the plurality of ground vias 202 necessary to set the cutoff frequency to a frequency F (56 GHz) corresponding to the bit rate. That via pitch (the equilateral triangular lattice spacing) is the first distance (L1). For the cutoff frequency of 56 GHz, the first distance (L1) is 1.0 mm. For the cutoff frequency of 28 GHz, the first distance (L1) is 1.8 mm.

With an actual printed circuit board, the area of the ground conductor layer is limited, and the number of ground vias 202 arranged is limited. It has been found that a cutoff frequency in this case is always higher than a cutoff frequency obtained from the curved line shown in FIG. 6. Therefore, in the case where the via pitch of the plurality of ground vias 202 formed on an actual printed circuit board is set to the first distance (L1), that is, 1.0 mm, the actual cutoff frequency turns out to be higher than the cutoff frequency shown in FIG. 6, that is, 56 GHz. Also, a triangle defined by three adjacent ground vias 202 on an actual printed circuit board is not necessarily an equilateral triangle. In this case as well, the actual cutoff frequency is always higher than the cutoff frequency obtained from the curved line shown in FIG. 6 when all of the ground vias define triangles and the length of each of the three sides of each triangle is equal to or shorter than the first distance (L1). Therefore, in the case where the via pitch of the plurality of ground vias 202 is set to the first distance (L1), or 1.0 mm, it is possible to cut off an electromagnetic wave in the TE mode and the TM mode in the frequency range from 0 to F=56 GHz. In the above, the first distance has been described.

The inventors have continued various studies to find that it is possible to cut off propagation of an electromagnetic wave (in the TE mode and the TM mode) that is generated at a signal via when an electronic signal is propagated in a transmission line when the printed circuit board according to this embodiment has the above described first to fourth characteristics. As a result, crosstalk between a signal via and a signal via in another channel can be significantly reduced.

Figure 7:
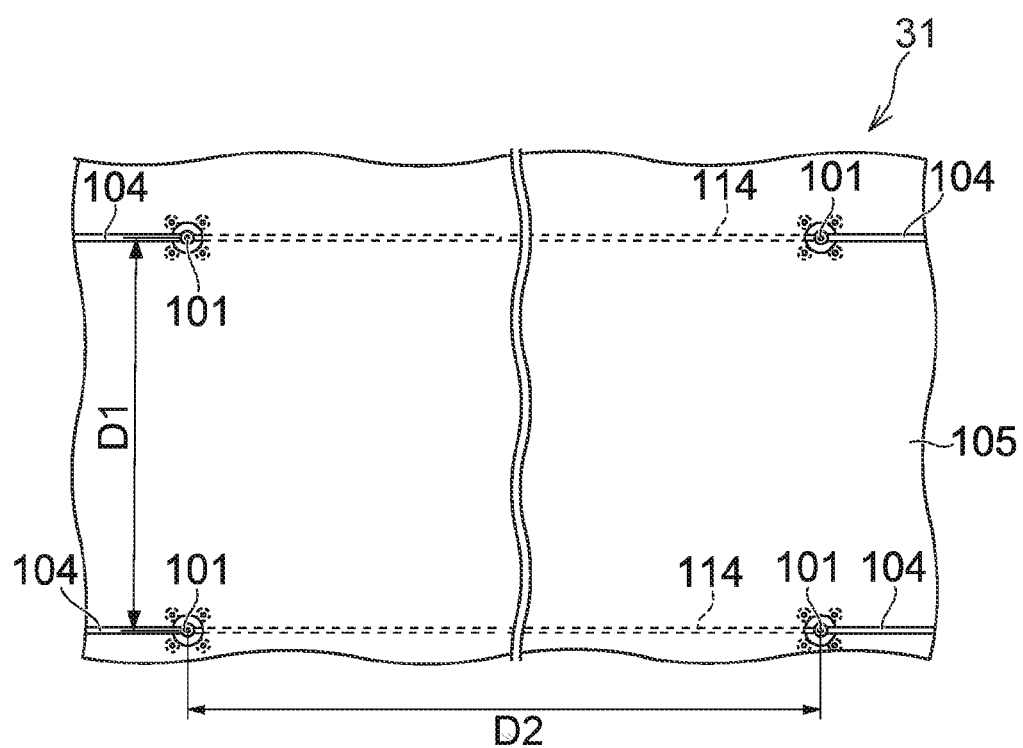
FIG. 7 is a schematic diagram showing a planer surface of apart of a printed circuit board according to the first embodiment of the present invention.

FIG. 7 is a schematic diagram showing a planar surface of a part of the printed circuit board 31 according to this embodiment. As described above, the printed circuit board 31 according to this embodiment includes a plurality of channels (transmission lines). That is, the printed circuit board 31 according to this embodiment has a plurality of transmission line structures each including a first signal line (the strip conductor 114), a second signal line (the strip conductor 104), the signal via 101, and a plurality of ground vias (the first ground via 102 and the second ground via 103). FIG. 7 shows a part of two channels out of those channels. For brevity, FIG. 7 shows some of the plurality of ground vias.

In each channel, a second transmission line is extending via the third transmission line to each of the respective both ends of the first transmission line. That is, sequentially from left to right in FIG. 7, a second transmission line, a third transmission line, a first transmission line, a third transmission line, and a second transmission line are connected. Each channel has the structure shown in FIG. 2. The two channels extend in parallel to each other in the horizontal direction in the drawing while keeping a predetermined interval in a plan view. The distance D1 between the centers of the signal vias 101 in two respective channels is 9 mm. Meanwhile, the distance D2 between the centers of two signal vias 101 in each channel (the length of the strip conductor 114) is 25 mm.

Figure 8:
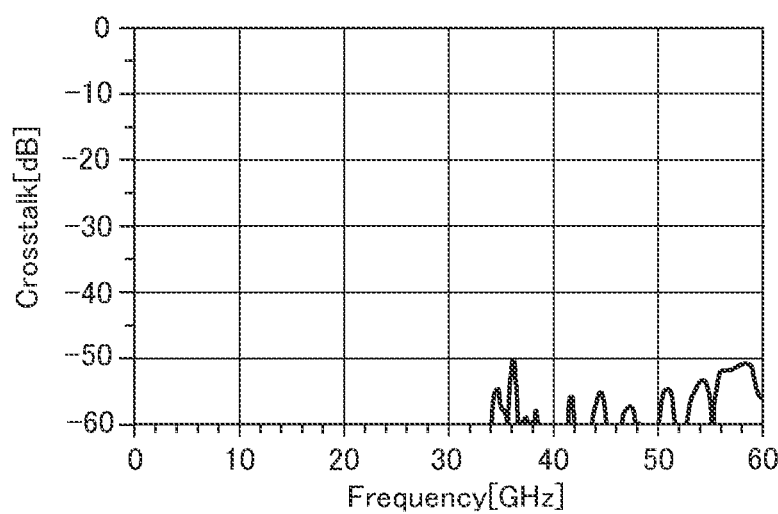
FIG. 8 shows crosstalk characteristic of a signal via formed in a printed circuit board according to the first embodiment of the present invention.

FIG. 8 shows crosstalk characteristic of the signal via 101 in the printed circuit board 31 according to this embodiment. The printed circuit board 31 has the two channels shown in FIG. 7. The curved line shown in FIG. 8 indicates near-end crosstalk characteristic of the two channels, and exhibits very preferable characteristics, including −50 dB or less in the frequency range between 0 and 60 GHz, and −60 dB or less in the frequency range between 0 and 33 GHz. A substantially same value is obtained for far-end crosstalk characteristic as well. As described above, with the printed circuit board 31 according to this embodiment, it is possible to reduce crosstalk between transmitter channels, between receiver channels, and between a transmitter channel and a receiver channel, respectively. Further, it is possible to reduce a placement area (the second polygon) where the first ground vias 102 and the second ground vias 103 are formed. This improves the degree of freedom in designing the strip conductor 114, and can produce an effect of achieving both high speeding and high density packaging.

For the printed circuit board according to this embodiment, it is not necessary to actively form a ground via outside the plurality of second ground vias (the second polygon), which improves the degree of freedom in designing a printed circuit board. Therefore, as shown in FIG. 7, a plurality of transmission line structures can be readily implemented. Below, a signal via 101 in a single channel shown in FIG. 7 will be considered. Specifically, the distance D1 between the center of one signal via 101 and that of a signal via 101 in another channel is 9 mm, and a plurality of first ground vias 102 and a plurality of ground vias 103 surrounding the signal via 101 in the other channel are arranged at positions farther away from the plurality of ground vias 103 surrounding the one signal via 101 (a second polygon) by the first distance L1 or longer, which satisfies the fourth characteristic according to this embodiment. Similarly, the distance D2 between the centers of one and another signal vias 101 in each channel is 25 mm, and a plurality of first ground vias 102 and a plurality of ground vias 103 surrounding the other signal via 101 are arranged at positions farther away from the plurality of ground vias 103 surrounding the one signal via 101 (the second polygon) by the first distance L1 or longer, which satisfies the fourth characteristic according to this embodiment. In other words, the influence caused by one transmission line structure on another transmission line structure is very small. On the contrary, in the case where a plurality of ground vias are arranged in a 2D lattice (for example, in JP 2011-066101 A and JP 2006-178209 A), the degree of freedom in designing a printed circuit board is limited. If no ground via is formed at one lattice point in a 2D lattice for any reason in designing, the absence of a ground via will result in increase of crosstalk.

Note here that speeding up and size and cost reduction have been made for an optical transmitter/receiver (an optical transceiver module) for optical fiber transmission with current spread of broadband networks. As to speeding up, recently, a bit rate in a class of 100 Gbit/s has begun to be used. Meanwhile, as to size and cost reduction, with MSA (Multi Source Agreement) based on Ethernet (registered trademark) taking an initiative, reduction of a case volume and the number of components has been attempted: current CFP is shifting to CFP2 or CFP4 (each MSA standard).

According to CFP2 and CFP4, serial data is transmitted as an electronic signal between an optical transmitter/receiver (TOSA or ROSA) and transmission equipment mounting the optical transmitter/receiver via a channel (a transmission line) formed using a differential transmission line (a balanced transmission line) on one surface of a printed circuit board. The specifications are based on OIF CEI-28G, which include four transmitter channels and four receiver channels with the bit rate of an electronic signal transmitted in each channel being in the range between 25 Gbit/s and 28 Gbit/s.

Speeding up for an optical transceiver device is still in progress, with an expectation that a class of 400 Gbit/s will be a mainstream in the next generation. Channels formed using transmission lines in a printed circuit board may include eight transmitter channels and eight receiver channels lines with the bit rate of an electronic signal transmitted in each channel being any between 50 Gbit/s and 56 Gbit/s. Specifications in that case will be based on OIF CEI-56G. The printed circuit board 31 according to this embodiment is desirable for the case where the bit rate of a digital electronic signal transmitted in each channel is 50 Gbit/s or greater, and in particular, preferable for the case of any between 50 Gbit/s and 56 Gbit/s.

The present invention has been achieved based on the knowledge obtained and studied by the inventors. It is necessary to reduce crosstalk between transmitter channels, between receiver channels, and between a transmitter channel and a receiver channel, respectively, even when the bit rate of a digital electronic signal transmitted in each channel is in a higher range, such as any between 50 Gbit/s and 56 Gbit/s. In particular, it is necessary to further reduce crosstalk between a transmitter channel and a receiver channel as the intensity of a receiver signal is small, compared to that of a transmitter signal. The inventors have analyzed a mechanism of a high speed digital channel including a first transmission line, a second transmission line, and a third transmission line connecting the first transmission line and the second transmission line, similar to the printed circuit board 31 according to this embodiment, through actual measurement and using 3D electromagnetic field analysis tool, and obtained the knowledge below.

(A) A part of an electromagnetic wave (the TEM mode) propagated in a first transmission line or a second transmission line is converted into the TE mode and TE mode by a third transmission line (a signal via structure).

(B) An electromagnetic wave (the TE mode and the TM mode) generated in a signal via in the third transmission line is propagated in the first transmission line to reach a signal via in another channel at a relatively far position, and then converted from the TE mode and TM mode to the TEM mode by a third transmission line (a signal via structure) of that other channel.

(C) An electromagnetic wave (the TEM mode) generated in the third transmission line (a signal via structure) in that other channel is propagated in a first transmission line or second transmission line of that other channel, and crosstalk is resultantly caused.

The inventors have been studied whether or not it is possible to reduce crosstalk due to the above described mechanism by reducing the above described (B). However, as there is a problem mentioned below, the inventors have found that this idea is not appropriate in view of simultaneous achievement of crosstalk reduction and high density packaging.

JP 2014-138015 A discloses a structure in which ground vias are arranged in a square lattice with a pitch of 2 mm in an entire space covered, on the above and below thereof, each by a conductor layer at a ground potential. Referring to JP 2006-178209 A, it can be estimated that the area with the ground vias arranged therein in a lattice can cut off the TE mode and the TM mode to thereby block propagation of an electromagnetic wage generated in a signal via. However, as the upper limit of the frequency that can be cut off by the ground vias arranged in a lattice at the pitch of 2 mm is about 29 GHz according to JP 2006-178209 A, there is a limit in speeding up of the transmission speed. For example, characteristic is insufficient to reduce crosstalk of an electronic signal with a bit rate between 50 Gbit/s and 56 Gbit/s.

JP 2011-066101 A discloses a structure in which vias at a desired potential are arranged in a square lattice with a pitch of 1 mm in an entire space covered, on the above and below thereof, each by a conductor layer. When it is assumed, with reference to JP 2006-178209 A, a case in which the vias (metal posts) arranged in a square lattice are connected to the upper and lower conductor layers, it can be estimated that the TE mode and the TM modes can be cut off in the area where the vias are arranged in a lattice, to thereby block propagation of an electromagnetic wave generated in a signal via. As the upper limit of the frequency that can be cut off by the vias arranged in a square lattice with the pitch of 1 mm is 52 GHz according our research, this case can produce an effect of reducing crosstalk of an electronic signal having a bit rate of about 52 Gbit/s.

However, in an example of placement of signal lines in an inner layer, disclosed in JP 2011-066101 A, the area for arranging vias is large, and the degree of freedom in placing a signal line is very small, which is expected to be an obstacle in achieving high density packaging. Additionally, although it is necessary to arrange vias, such as a control signal via and a power source line via, other than a ground via in the area in order to mount a line for a control signal other than a transmitter/receiver signal and a power supply line for supplying a power to an IC on an actual printed circuit board, it is difficult to lay out a via other than a ground via while maintain a lattice arrangement of the ground vias according to the JP 2011-066101 A. Therefore, there is a problem in that it is difficult to ensure an area for mounting other components, and the example is thus not appropriate in view of simultaneous achievement including high density packaging as well.

On the contrary, even when a plurality of transmission lines for a transmitter signal and a plurality of transmission lines for a receiver signal are formed in the printed circuit board according to this embodiment, it is possible to reduce crosstalk between transmitter channels, between receiver channels, and between a transmitter channel and a receiver channel, respectively. Further, by ensuring a high degree of freedom in placing a signal line in an inner layer and in forming a via other than a ground via, it is possible to reduce the placement area. This makes it possible to implement a printed circuit board adapted to both high speeding and high density packaging. In particular, with a signal via structure for connecting a signal line on a surface layer and a signal line in an inner layer, it is possible to implement a printed circuit board capable of both ensuring high quality in transmitter/receiver waveform and size reduction.

In order to prove the effect of the present invention, crosstalk characteristic of a printed circuit board 81 according to a comparative example mentioned below is analyzed.

Figure 21:
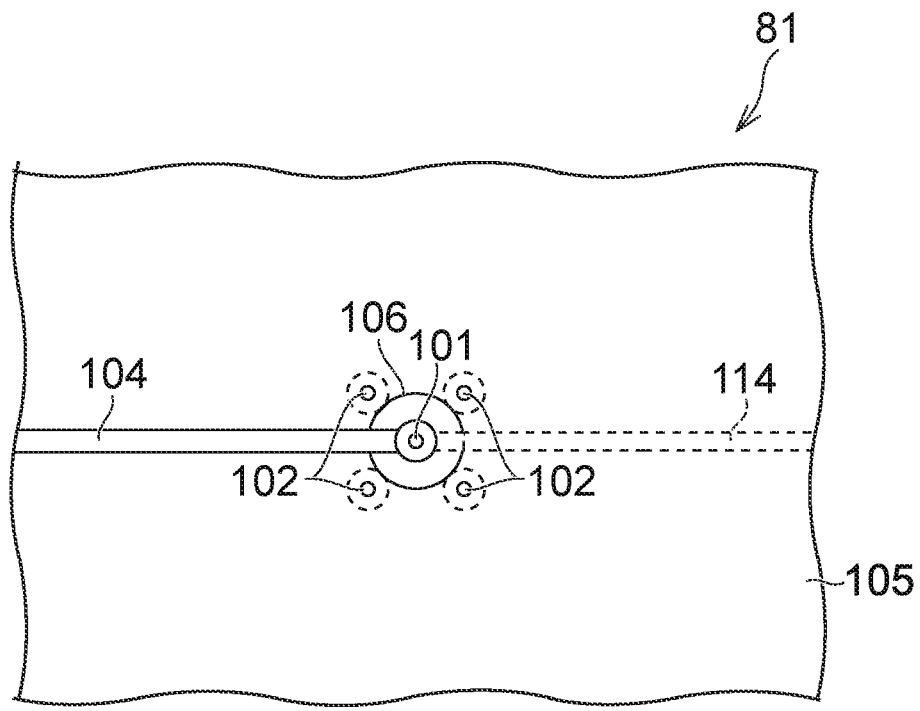
FIG. 21 is a schematic diagram showing a planer surface of a part of a printed circuit board according to a comparative example.

FIG. 21 is a schematic diagram showing a planar surface of a part of a printed circuit board 81 according to a comparative example. In the printed circuit board 81, a plurality of second ground vias 103 are not formed. The printed circuit board 81 according to the comparative example includes two channels (transmission lines), similar to the printed circuit board 31 according to the embodiment shown in FIG. 7. That is, the structure of the printed circuit board 81 is similar to that of the transmission line of the printed circuit structure 31 according to the embodiment except that a plurality of second ground vias 103 are not formed. The sizes are the same as well. That is, the distance D1 between the centers of the signal vias 101 in two respective channels is 9 mm, and the distance D2 (or the length of the strip conductor 114) between the centers of the signal vias 101 in each channel is 25 mm.

Figure 22:
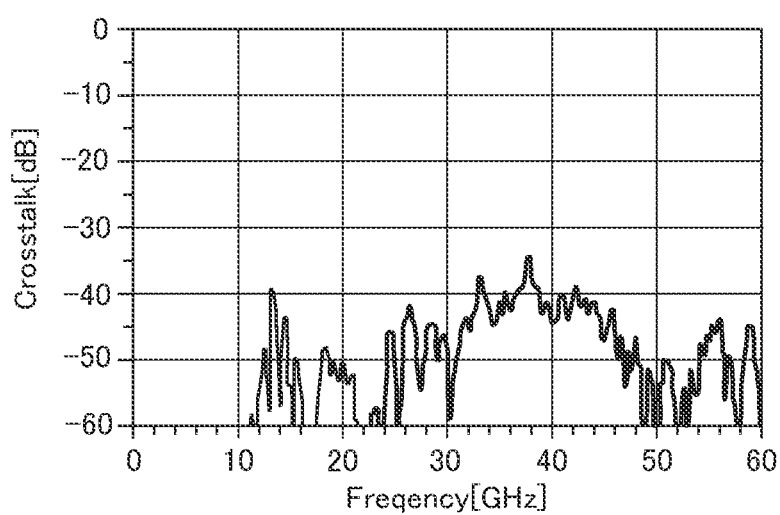
FIG. 22 shows crosstalk characteristic of a signal via formed in a printed circuit board according to the comparative example.

FIG. 22 shows crosstalk characteristic of the signal via 101 of the printed circuit board 81 according to the comparative example. The curved line shown in FIG. 22 indicates near-end crosstalk characteristic obtained in actual measurement, indicating excess over −50 dB mostly in the frequency range between 33 GHz and 60 GHz, and marking −34 dB at the maximum. Moreover, the near-end crosstalk characteristic often exceeds −50 dB and marks −40 dB at the maximum in the frequency range between 11 GHz and 33 GHz. That is, it is not possible to sufficiently reduce crosstalk with the printed circuit board 81 according to the comparative example, as shown in FIG. 22. On the contrary, crosstalk reduction is significantly improved with the printed circuit board 31 according to this embodiment.

In the above, the printed circuit board 31 according to this embodiment has been described. The printed circuit board 31 according to this embodiment has a plurality of transmission lines (a plurality of channels), and can reduce crosstalk between transmitter channels, between receiver channels, and between a transmitter channel and a receiver channel, respectively. That is, the prevent invention produces a significant effect with respect to a printed circuit board having a plurality of channels, as described above. This is similarly applicable to the embodiments described below.

Also, although it is described that an electronic signal transmitted in a channel (a transmission line) of the printed circuit board 31 according to this embodiment is a binary digital modulation signal, this is not an exclusive example. The electronic signal may be a multi-level digital modulation signal. In this case, a bit rate should be read as a symbol rate (or a modulation rate) and the unit "bit/s" should be read as the unit "baud". This is similarly applied to the embodiments described below.

Second Embodiment

Similar to the printed circuit board 31 according to the first embodiment, a printed circuit board 32 according to a second embodiment of the present invention has a plurality of high speed digital signal transmission lines, in which the transmission line is a differential transmission line. A differential transmission line includes a pair of strip conductors, and it can be said that one pair of transmission lines constitutes one channel.

Figure 9:
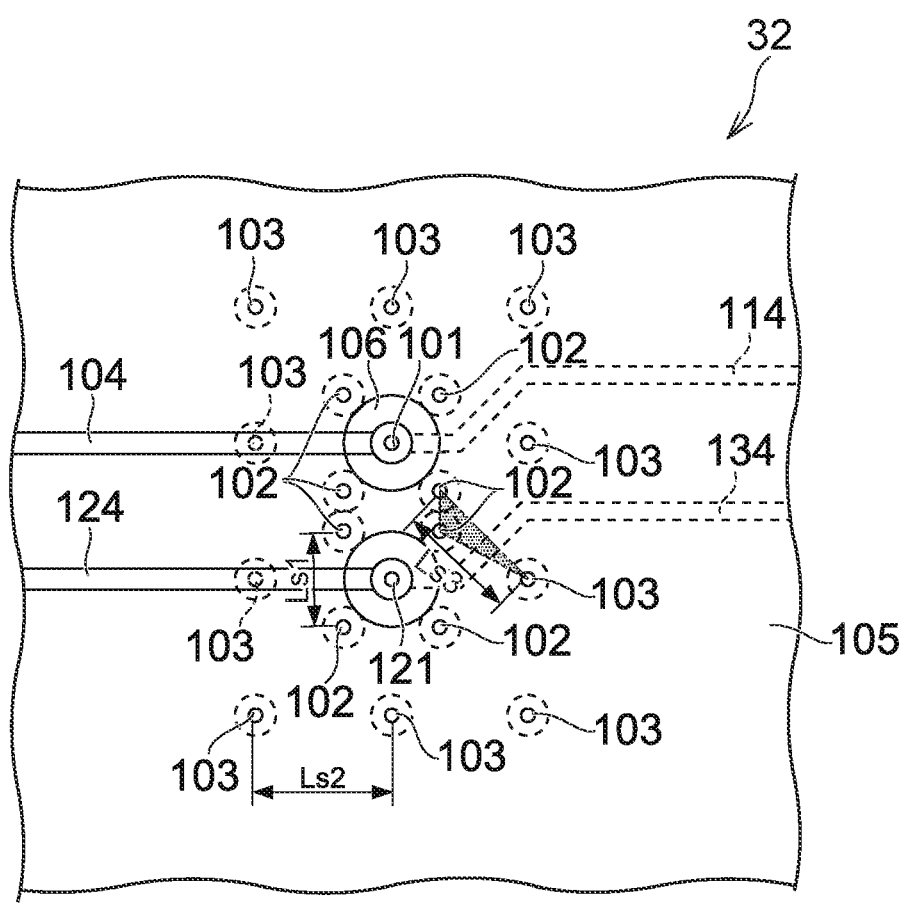
FIG. 9 is a schematic diagram showing a planer surface of apart of a printed circuit board according to a second embodiment of the present invention.

FIG. 9 is a schematic diagram showing a planar surface of a part of the printed circuit board 32 according to this embodiment. A first transmission line includes two ground conductor layers 105, 115 and one pair of strip conductors 114, 134 disposed between the ground conductor layers 105, 115. A first signal line includes a pair of first sub-signal lines, and the pair of first sub-signal lines are the one pair of strip conductors 114, 134. Meanwhile, a second transmission line includes the ground conductor layer 105 and one pair of strip conductors 104, 124. A second signal line includes a pair of second sub-signal lines, and the pair of second sub-signal lines are the one pair of strip conductors 104, 124. A third transmission line includes signal vias 101, 121 and a plurality of first ground vias 102. The signal vias 101, 121 formed in the third transmission line are one pair of sub-signal vias, and it can be said that the signal via includes a pair of sub-signal vias. The signal via 101 electrically connects the strip conductor 114 and the strip conductor 104, and the signal via 121 electrically connects the strip conductor 134 and the strip conductor 124. That is, one of the pair of sub-signal vias electrically connects one of the pair of first sub-signal lines and one of the pair of second sub-signal lines, and another one of the pair of sub-signal vias electrically connects another one of the pair of first sub-signal lines and another one of the pair of second sub-signal lines.

The printed circuit board 32 according to this embodiment is similar to the printed circuit board 31 according to the first embodiment except the following. That is, the first transmission line includes the strip conductor 134 in addition to the strip conductor 114. Also, the shapes of the pair of strip conductors 114, 134 are different. Further, the second transmission line includes the strip conductor 124 in addition to the strip conductor 104. Furthermore, the third transmission line includes the signal via 121 in addition to the signal via 101. The numbers and layouts of the plurality of first ground vias 102 and the plurality of second ground vias 103 are different.

Note here that the distance between the centers of the signal vias 101, 102 making a pair is 1 mm. The strip conductors 104, 124 making a pair extend in parallel to each other rightward in the drawing while keeping the distance between the respective center lines as 1 mm to reach the signal vias 101, 121 making a pair, respectively. The strip conductors 114, 134 making a pair extend rightward in parallel to each other from the respective signal vias 101, 121 making a pair, then bend in a counterclockwise direction relative to the extending direction (rightward), then extend upper rightward in the drawing in parallel to each other, then bend in a clockwise direction relative to the extending direction (an upper rightward direction), and then extend rightward in the drawing. The distance between the center lines of the strip conductors 114, 134 making a pair at portions thereof extending rightward in the drawing is kept as 1 mm, same as that between the strip conductors 104, 124 making a pair. Further, the distance in the vertical direction in the drawing between the center lines of the respective strip conductors 114, 134 making a pair at portions thereof extending upper rightward in the drawing is kept as 1 mm. That is, the distance between the center lines at the portions is kept as a distance shorter than 1 mm. Note that the pair of strip conductors 114, 134 are bent due to the presence of the second ground via 103.

In this embodiment, as a plurality of ground vias are laid out as shown in FIG. 9, the first signal lines (the strip conductors 114, 134) are bent so as to avoid the plurality of ground vias in a plan view. Meanwhile, although the second ground vias 103 are positioned on the second signal lines (the strip conductors 104, 124) in a plan view, the second signal lines do not touch the second ground vias 103 as the second signal lines are disposed above the ground conductor layer 105. If the first signal lines (the strip conductors 114, 134) extend straight along the direction in which the second signal lines extend (in the horizontal direction in the drawing), the second ground vias 103 will be arranged on the first signal line in a plan view. As the first signal lines are disposed inside the first dielectric layer (the dielectric layer 109B), the first signal line will touch the second ground vias 103, and resultantly electrically connected. To address the above, the first signal line is bent relative to the direction in which the second signal line extends (in the direction in which the second signal line reaches the signal via) in a plan view to thereby avoid touching the plurality of ground vias.

A plurality of (eight here) first ground vias 102 (the first ground via group) are laid out as shown in FIG. 9. Specifically, four first ground vias 102 (four first points) are laid out so as to surround each of the signal vias 101, 121 making a pair, similar to the first ground vias 102 according to the first embodiment. A square is resulted when the four first points are connected. The plurality (eight here) of first points where the plurality of (eight here) first ground vias 102 are respectively formed are positioned on the line of a first polygon so as to contain inside thereof the pair of signal vias 101, 121 (a pair of sub-signal vias). Note that the first polygon is a rectangle, and that the plurality of first points include four first points placed at the respective vertexes of the rectangle, two on the right side of the rectangle extending in the vertical direction in the drawing, and two on the left side of the rectangle. The distance Ls1 is the length (the equal interval) of one side of the square defined by the four first points surrounding each sub-signal via, wherein the distance Ls1 is 0.707 mm here.

Surrounding the plurality of (eight, here) first ground vias 102, a plurality of (ten here) second ground vias 103 are formed at a plurality of respective second points. The plurality of second points are laid out at equal intervals, and a rectangle is resulted when the adjacent second points are connected. That is, the second polygon is a rectangle, and contains inside thereof the first polygon that is similarly a rectangle. As the distances between the respective adjacent second points are equal intervals, the distance Ls2 takes the value of the equal interval, wherein the distance Ls2 is 1.0 mm here.

In this embodiment, a triangle including a side having a length equal to a distance Ls3 is the triangle shown shaded in FIG. 9. The distance Ls3 is 0.93 mm here. That is, the values of the distances Ls1, Ls2, Ls3 are all equal to or less than 1.0 mm, or the first distance (L1). The printed circuit board 32 according to this embodiment has all of the first to fourth characteristics described in the first embodiment.

In the printed circuit board 32 according to this embodiment, one channel is formed using a differential transmission line. Even in such a case, it is possible to reduce crosstalk between transmitter channels, between receiver channels, and between a transmitter channel and a receiver channel, respectively. Further, it is possible to reduce the placement area (the second polygon) where the first ground vias 102 and the second ground vias 103 are formed, which can improve the degree of freedom in designing the strip conductors 114, 134. That is, it is possible to obtain an effect of achieving both high speeding and high density packaging. The printed circuit board 32 according to this embodiment is preferable for the case where the bit rate of a digital electronic signal transmitted in each channel is any between 50 Gbit/s and 56 Gbit/s.

In the above, the printed circuit board 32 according to this embodiment has been described. In the printed circuit board 32 according to this embodiment, one channel is formed using a differential transmission line. A signal via includes a pair of sub-signal vias, and the pair of sub-signal vias is contained inside the first polygon. That is, whether a transmission line is a single-end transmission line or a differential transmission line, the present invention can produce a significant effect. This is similarly applicable to the embodiments below.

Third Embodiment

A printed circuit board 33 according to a third embodiment of the present invention is similar to the first embodiment except that the layout of the plurality of ground vias is different from the printed circuit board 31 according to the first embodiment. The second signal line (the strip conductor 104) and the first signal line (the strip conductor 114) are extending on a single straight line in a plan view.

Figure 10:
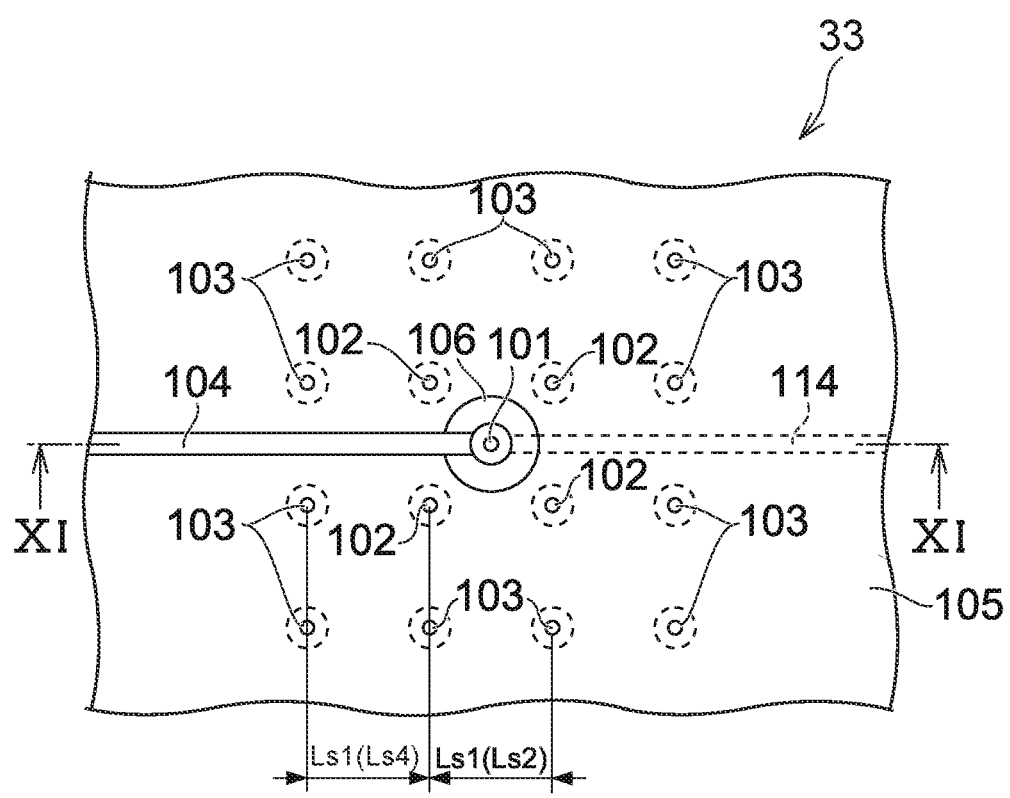
FIG. 10 is a schematic diagram showing a planer surface of a part of a printed circuit board according to a third embodiment of the present invention.
Figure 11:
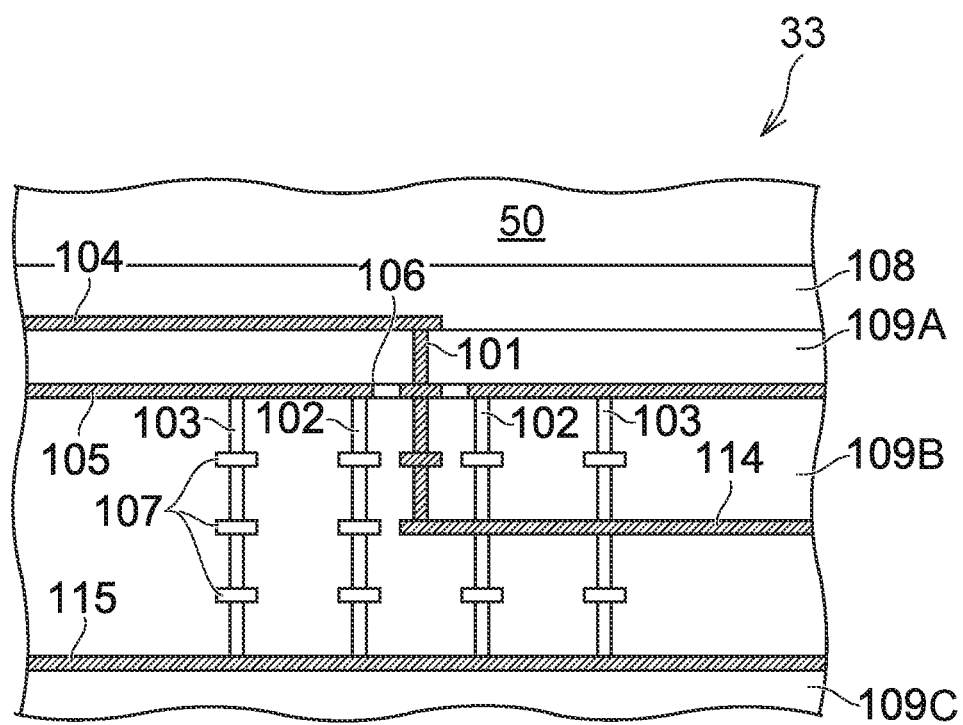
FIG. 11 is a schematic diagram showing a cross section of apart of a printed circuit board according to the third embodiment of the present invention.

FIG. 10 is a schematic diagram showing a planar surface of apart of the printed circuit board 33 according to this embodiment. FIG. 11 is a schematic diagram showing a part of a cross section of the printed circuit board 33 according to this embodiment. In FIG. 11, a cross section along the line XI-XI in FIG. 10 is shown. FIGS. 10 and 11 correspond to FIGS. 2 and 3, respectively, according to the first embodiment.

A plurality of first ground vias 102 (the first ground via group) are formed at a plurality of respective first points. As shown in FIG. 10, four first points are laid out at equal intervals, and a square is resulted when the adjacent first points are connected. As the distances between the respective adjacent first points are equal intervals, the distance Ls1 takes the value of the equal interval. A transmission line (a third transmission line) imitating a coaxial line is formed including the signal via 101 and the plurality of first ground vias 102.

The plurality of first points where the plurality of respective first ground vias 102 are formed are positioned on a line of a first rectangle in a plan view, and are positioned at least at all vertexes. The first rectangle is a square here, and contains the signal via 101 inside thereof. The plurality of first points are four first points placed at the respective vertexes of the square. In other words, no first point is placed on the line of the square except at the vertexes. However, a first point may be additionally placed on a side of the square in addition to at the vertexes (four vertexes) of the square.

A plurality of second ground vias 103 (the second ground via group) are formed at a plurality of respective second points. Surrounding the plurality of first ground vias 102, twelve second points are laid out at equal intervals, and a square is resulted when the adjacent second points are connected. As the distances between the respective adjacent second points are equal intervals, the distance Ls2 takes the value of the equal interval. The plurality of second points where the plurality of second ground vias 103 are respectively formed are positioned on the line of a second rectangle in a plan view, and are positioned at least at all vertexes. The second rectangle contains the first rectangle on or inside a side thereof. Note that the second rectangle contains the first rectangle inside a side thereof here. The second rectangle is a square, and the plurality of second points are twelve points including four second points placed at the respective vertexes of the square (the second rectangle) and eight placed two on each side of the square (except vertexes).

Characteristic of a printed circuit board according to this embodiment lines in the layout of the plurality of first points and the plurality of second points. Specifically, the first characteristic lies in that the distances between the respective adjacent first points are all equal to or shorter than the second distance. In this embodiment, the plurality of first points are laid out at equal intervals, and the distances between the respective adjacent first points are all equal to the distance Ls1, wherein the distance Ls1 is 0.9=here. Note that the second distance (L2) is 0.9 mm here, of which details will be described later.

The second characteristic lies in that the distances between the respective adjacent second points are all equal to or shorter than the second distance. In this embodiment, the plurality of second points are laid out at equal intervals, and the distances between the respective adjacent second points are all equal to the distance Ls2, wherein the distance Ls2 is 0.9 mm here.

The third characteristic lies in that at least one of the plurality of second points is placed within the second distance from each of the plurality of first points. The maximum length of the distance between each of the plurality of first points and the nearest second point from the first point is defined as a distance Ls4. In this embodiment, the plurality of first points and the plurality of second points are placed at respective lattice points of a square lattice, being arranged in a 4×4 square lattice (sixteen in total). That is, the distance between each of the plurality of first points and the nearest second point is equal to 0.9 mm, or the equal interval, and the distance Ls4 is 0.9 mm (Ls1=Ls2=Ls4). That is, the values of the distances Ls1, Ls2, Ls4 are all equal to 0.9 mm, or the second distance (Ls), being equal to or shorter than 0.9 mm.

The fourth characteristic lines in that no via connected to a potential other than a ground potential is formed in an area outside the signal via and inside the second rectangle, and that no ground via is formed outside the second rectangle within the second distance from the second rectangle. It is desirable that no other ground via is formed outside the second rectangle. If it is necessary to form a ground via for any need, a ground via will be formed at a position away from the second rectangle by the second distance or longer. In the case where a ground via is formed outside and away from the second rectangle by the second distance or longer, the placement density of the ground vias may be set lower, compared to that of the plurality of first ground vias (the first ground via group) and that of the plurality of second ground vias (the second ground via group), and the via pitch of the adjacent ground vias may be set in excess of the second distance (L2).

Whether the layout of the plurality of ground vias according to this embodiment satisfies the first to fourth characteristics of the first embodiment is considered. The distances between the respective adjacent first points are all 0.9 mm, being shorter than 1.0 mm, or the first distance. Moreover, the distances between the respective adjacent second points are all 0.9 mm, being shorter than 1.0 mm, or the first distance. However, as to a right angle isosceles triangle defined by a pair of adjacent first points and a near second point, the length of two sides thereof defining a right angle is 0.9 mm and that of the hypotenuse thereof is 1.15 mm. Therefore, the distance Ls3 is 1.15 mm, or longer than the first distance. That is, the layout of the plurality of ground vias according to this embodiment does not satisfy all of the first to fourth characteristics according to the first embodiment. However, the plurality of ground vias formed in a printed circuit board according to this embodiment satisfy all of the first to fourth characteristics according to this embodiment.

Below, the second distance will be described. The second distance serves as a reference value that defines the layout of the plurality of ground vias according to the present invention. The second distance corresponds to a square lattice spacing with a frequency corresponding to an electronic signal transmitted as a cutoff frequency in the case where a plurality of ground vias are arranged in a square lattice to electrically connect the first ground conductor layer and the second ground conductor layer. That is, in a periodic structure in which a plurality of ground vias are arranged in a square lattice, the second distance is a distance with a frequency corresponding to an electronic signal transmitted in the transmission line as a cutoff frequency. For the printed circuit board 33 according to this embodiment, the bit rate of an electronic signal transmitted in each channel is any between 50 Gbit/s and 56 Gbit/s, and the cutoff frequency is defined as 56 GHz so as to be adapted to that bit rate band. That is, the frequency corresponding to an electronic signal transmitted in the transmission line is 56 GHz.

Figure 12:
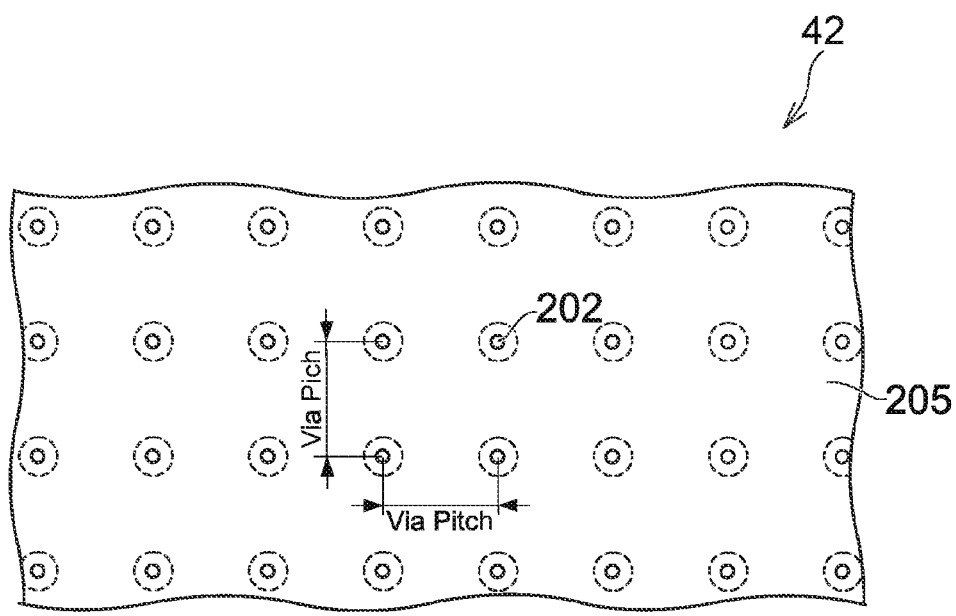
FIG. 12 is a schematic diagram showing a periodic structure in which ground vias are arranged in a square lattice.

FIG. 12 is a schematic diagram showing a periodic structure in which ground vias are arranged in a square lattice. The printed circuit board 42 shown in FIG. 12 includes a transmission line similar to the first transmission line according to this embodiment, wherein the size of the transmission line is the same as that of the first transmission line according to this embodiment (and the first embodiment). A printed circuit board 42 shown in FIG. 12 is different from the printed circuit board 41 shown in FIG. 5 in layout of the plurality of ground vias 202. Specifically, the plurality of ground vias 202 for connecting two ground conductor layers are arranged in a square lattice at equal intervals. The periodic structure with the plurality of ground vias 202 is a 2D lattice structure referred to as a square lattice.

Figure 13:
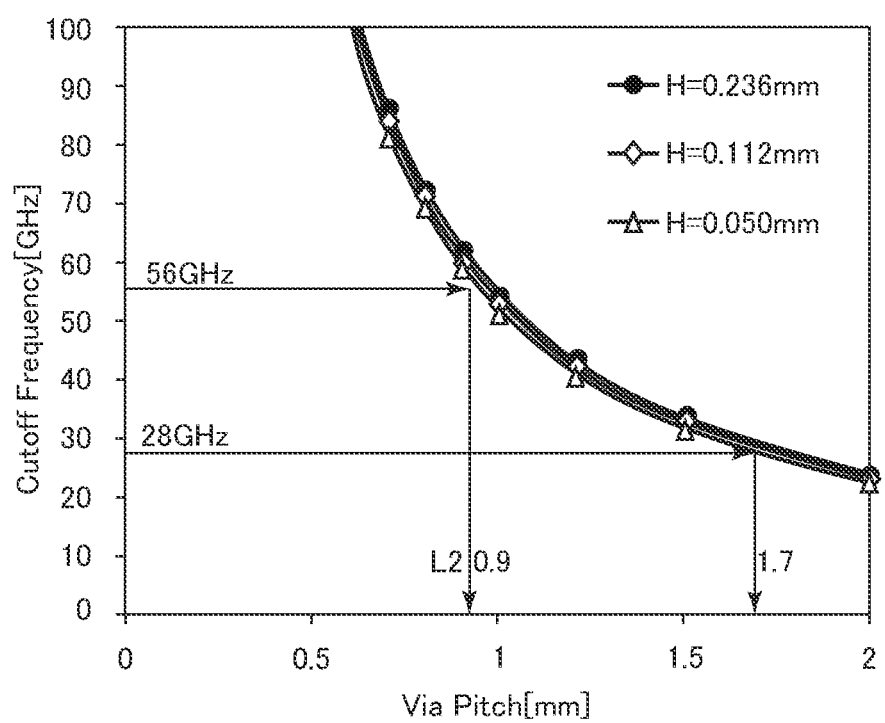
FIG. 13 shows a result of calculation of a cutoff frequency relative to a via pitch of the periodic structure shown in FIG. 12.

FIG. 13 shows a result of calculation of a cutoff frequency relative to a via pitch of the periodic structure shown in FIG. 12. Similar to FIG. 6, in FIG. 13, not only a case in which the intervals between the strip conductor and the upper and lower respective ground conductor layers (the thickness of a dielectric layer) are 0.112 mm, but also a case in which the interval is about ½ times (0.050 mm) as long as that interval, and a case in which the interval is about two times (0.236 mm) as long as that interval are plotted. Similar to FIG. 6, as the via pitch of the adjacent ground vias 202 is made shorter, the cutoff frequency exhibits a sharp increase. Meanwhile, when the thickness of the dielectric layer is changed in the range between a half and two times, change in the cutoff frequency is very small.

It is possible to obtain, from FIG. 13, a via pitch of the plurality of ground vias 202 necessary to set the cutoff frequency to a frequency F (56 GHz) corresponding to the bit rate. That via pitch (the square lattice spacing) is the second distance (L2). For the cutoff frequency of 56 GHz, the second distance (L2) is 0.9 mm. For the cutoff frequency of 28 GHz, the second distance (L2) is 1.7 mm.

In an actual printed circuit board, the area of the ground conductor layer is limited, and the number of ground vias 202 formed is limited. As it has been found that a cutoff frequency in that case is always higher than the cutoff frequency obtained from the curved line shown in FIG. 13, the actual cutoff frequency turns out to be higher than the cutoff frequency shown in FIG. 13, or 56 GHz, when the via pitch of the plurality of ground vias 202 formed on an actual printed circuit board is set equal to the second distance (L2), or 0.9 mm. Below, cases where a plurality of ground vias are not arranged in a square lattice on an actual printed circuit board will be considered. As to a case in which the plurality of ground vias are arranged in a rectangular lattice, it has been found that a cutoff frequency in that case is always higher than a cutoff frequency obtained from the curved line shown in FIG. 13 as long as the lengths of the respective sides of the rectangle are all equal to or shorter than the second distance (L2). Similarly, where a quadrangle defined by four adjacent ground vias 202 is not always a square, an actual cutoff frequency is always higher than the cutoff frequency obtained from the curved line shown in FIG. 13 even in such a case as long as the ground vias all constitute quadrangles and the lengths of the four sides of each quadrangle are all equal to or shorter than the second distance (L2). That is, when the via pitch of the plurality of ground vias 202 is set to 0.9 mm, or the second distance (L2), it is possible to cut off an electromagnetic wave in the TE mode and the TM mode in the frequency range between 0 and F=56 GHz. In the above, the second distance has been described.

The inventors have continued further various studies to find that, even when the printed circuit board according to this embodiment does not satisfy all of the first to fourth characteristics according to the first embodiment, satisfaction of the first to fourth characteristics according to this embodiment enables sufficient blocking of propagation of an electromagnetic wave (TE mode and TM mode) that is generated in a signal via when an electronic signal is propagated in a transmission line. As a result, it is possible to sufficiently reduce crosstalk between a signal via and a signal via in another channel. Note that the plurality of first points and the plurality of second points according to this embodiment are placed at lattice points of a square lattice, which is a simple structure, and therefore it is possible to readily set a condition so as to satisfy the first to third characteristics according to this embodiment.

Figure 14:
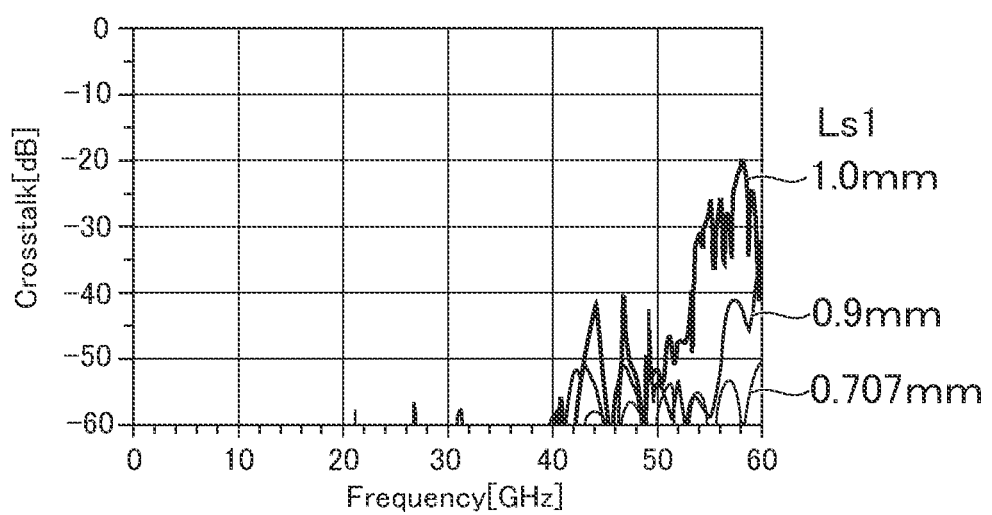
FIG. 14 shows crosstalk characteristic of a signal via formed in a printed circuit board according to the third embodiment of the present invention.

FIG. 14 shows crosstalk characteristic of the signal via 101 formed in the printed circuit board 33 according to this embodiment. Specifically, similar to FIG. 7, the printed circuit board 33 has two channels, and the distance D1 between the centers of the signal vias 101 in the two respective channels is 9 mm. The distance D2 between the centers of the signal vias 101 in each channel (the length of the strip conductor 114) is 25 mm. Similar to the curved line shown in FIG. 8, the three curved lines shown in FIG. 14 indicate near-end crosstalk characteristic, showing not only a case in which the via pitch (the distance Ls1) of the plurality of ground vias (the first ground via 102 and the second ground via 103) is 0.9 mm (the second distance (L2)), but also cases of the via pitch being 0.707 mm and 1.0 mm, respectively. In the case where the via pitch (the distance Ls1) according to this embodiment is 0.9 mm, the crosstalk characteristic indicates −50 dB or less in the frequency range between 0 and 56 GHz, and −60 dB or less in the frequency range between 0 and 40 GHz. That is, very preferable characteristic can be obtained. A substantially same value is obtained for far-end crosstalk characteristic as well. As described above, with the printed circuit board 31 according to this embodiment, it is possible to reduce crosstalk between transmitter channels, between receiver channels, and between a transmitter channel and a receiver channel, respectively. Additionally, it is possible to reduce the placement area (the second rectangle) where the first ground vias 102 and the second ground vias 103 are formed, which can improve the degree of freedom in designing the strip conductor 114. That is, it is possible to obtain an effect of achieving both high speeding and high density packaging. The printed circuit board 33 according to this embodiment is preferable for the case where the bit rate of a digital electronic signal transmitted in each channel is any between 50 Gbit/s and 56 Gbit/s.

Naturally, the via pitch (the distance Ls1) of the plurality of ground vias may be set shorter than 0.9 mm. In the case where the via pitch (the distance Ls1) is set to 0.707 mm, or being sufficiently shorter the second distance (L2), the near-end crosstalk characteristic shown in FIG. 14 indicates −50 dB or less in the frequency range between 0 and 60 GHz and −60 dB or less in the frequency range between 0 and 40 GHz. That is, very preferable characteristic can be obtained. The characteristic is preferable even for the case where the bit rate of a digital electronic signal transmitted in each channel exceeds 56 Gbit/s.

Meanwhile, in the case where the via pitch (the distance Ls1) of the plurality of ground vias is set long, or 1.0 mm, being longer than the second distance (L2), the near-end crosstalk characteristic shown in FIG. 14 shows an excess over −40 dB, marking −20 dB at the maximum, in the frequency range between 53 GHz and 60 GHz, and an excess over −50 dB, marking −40 dB at the maximum, in the frequency range between 43 GHz and 53 GHz. That is, this is not appropriate for the case where the bit rate of a digital electronic signal transmitted in each channel is 56 Gbit/s. That is, this fact supports the effect of the printed circuit board 33 according to this embodiment.

In using for transmission of a digital modulation signal with the bit rate of 28 Gbit/s, the second distance (L2) is 1.7 mm, and therefore, the case in which the distances Ls1, Ls2, Ls4 are 1.0 mm sufficiently satisfies the condition that all distances are equal to or shorter than the second distance (L2). The near-end crosstalk characteristic shown in FIG. 14 exhibits sufficient reduction in the frequency range between 0 and 28 GHz. Therefore, the case where the via pitch (the distance Ls1) of the plurality of ground vias is 1.0 mm as well is preferable for the case where the bit rate of a digital modulation signal transmitted in a channel is 28 Gbit/s.

Fourth Embodiment

A printed circuit board 34 according to a fourth embodiment of the present invention is similar to the first embodiment except that the layout of the plurality of ground vias is different from that of the printed circuit board 31 according to the first embodiment, and that the first signal line (the strip conductor 114) is bent similar to the second embodiment. The plurality of second points according to this embodiment are placed on a side of the second polygon in addition to at all vertexes of the second polygon. Note that the first signal line according to this embodiment (the strip conductor 114) is bent so as to avoid the plurality of ground vias, similar to the second embodiment.

Figure 15:
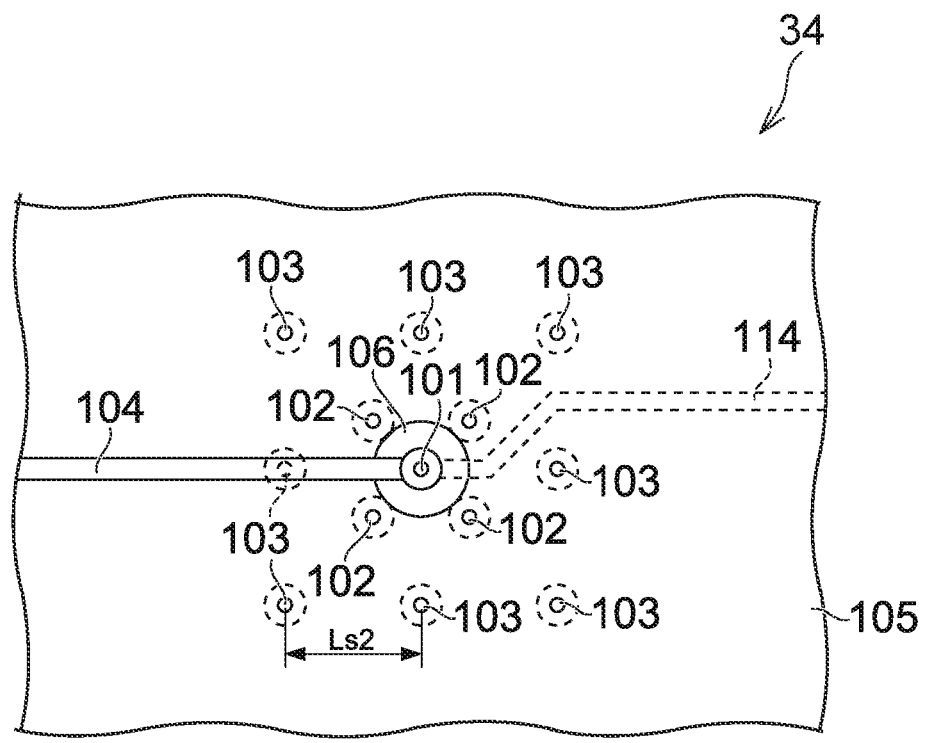
FIG. 15 is a schematic diagram showing a planer surface of a part of a printed circuit board according to a fourth embodiment of the present invention.

FIG. 15 is a schematic diagram showing a planar surface of a part of the printed circuit board 34 according to this embodiment. FIG. 15 corresponds to FIG. 2 according to the first embodiment. The layout of the plurality of (four here) first ground vias 102 (the plurality of first points) is similar to that in the first embodiment, and the plurality of first points are laid out at equal intervals (0.707 mm), wherein the distance Ls1 is 0.707 mm here.

As shown in FIG. 15, the structure of the plurality of second ground vias 103 (the second ground via group) is different from that of the second ground via 103 according to the first embodiment. Specifically, the plurality of (eight here) second ground vias 103 (second points) are laid out surrounding the plurality of (four here) first ground vias 102. Moreover, the plurality of (eight here) second points are laid out at equal intervals, and a square is resulted when the adjacent second points are connected. As the distances between the respective adjacent second points are equal intervals, the distance Ls2 takes the value of the equal interval. The distance Ls2 is 1.0 mm here. The plurality of second points include four second points placed at the respective vertexes of a square and four placed each (at a midpoint) on each side.

In this embodiment, the distance Ls3 is 0.74 mm. Note that the distance Ls3 is the length of a hypotenuse of a triangle that is defined by connecting one side of the first polygon (a square) and a midpoint of a near side of a second polygon (a square). Therefore, the distances Ls1, Ls2, Ls3 are all equal to or shorter than 1.0 mm, or the first distance (L1). The printed circuit board 34 according to this embodiment has all of the first to fourth characteristics described in the first embodiment. It is confirmed, based on a result of calculation using electromagnetic field analysis tool, that the printed circuit board 34 according to this embodiment is preferable for the case where the bit rate of a digital electronic signal transmitted in each channel is any between 50 Gbit/s and 56 Gbit/s.

Fifth Embodiment

A printed circuit board 35 according to a fifth embodiment of the present invention is similar to the first embodiment except that the layout of the plurality of ground vias is different from the printed circuit board 31 according to the first embodiment, and that the first signal line (the strip conductor 114) is bent similar to the second embodiment. The first polygon according to this embodiment is inscribed in the second polygon. Note that the first signal line according to this embodiment (the strip conductor 114) is bent so as to avoid the plurality of ground vias, similar to the second embodiment.

Figure 16:
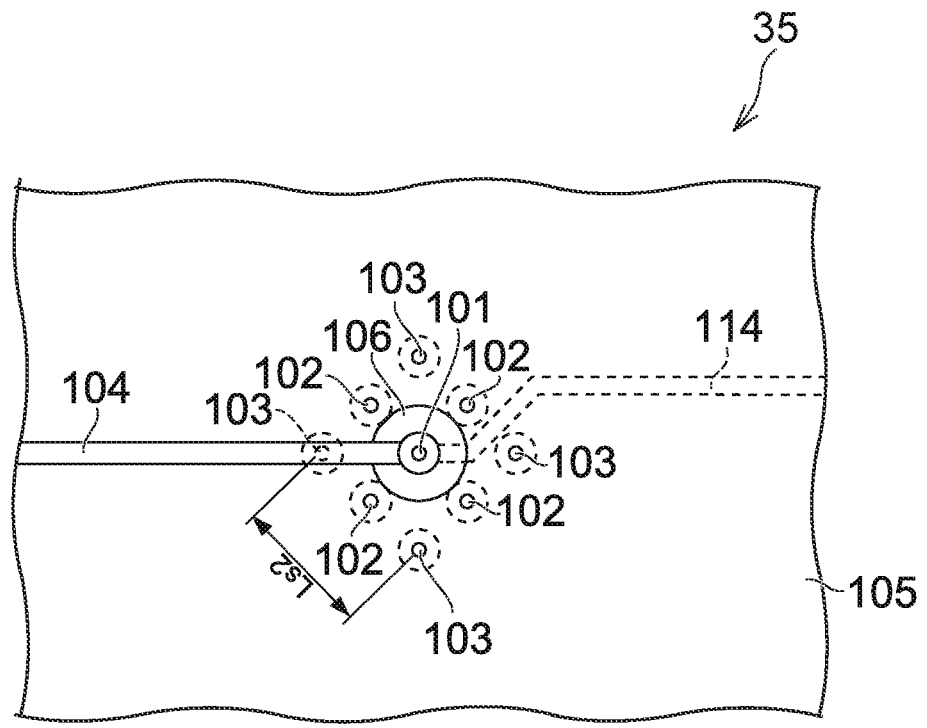
FIG. 16 is a schematic diagram showing a planer surface of a part of a printed circuit board according to a fifth embodiment of the present invention.

FIG. 16 is a schematic diagram showing a planar surface of a part of the printed circuit board 35 according to this embodiment. FIG. 16 corresponds to FIG. 2 according to the first embodiment. The layout of the plurality of (four here) first ground vias 102 (the plurality of first points) is similar to that in the first embodiment, and the plurality of first points are laid out at equal intervals (0.707 mm). The distance Ls1 is 0.707 mm here.

As shown in FIG. 16, the structure of the plurality of second ground vias 103 (the second ground via group) differs from that of the plurality of second ground vias 103 according to the first embodiment. The plurality of (four here) second points where a plurality of (four here) second ground vias 103 are respectively formed are placed at respective vertexes of the second polygon. The second polygon is a square, and the first polygon (a square) is inscribed in the second polygon (a square) such that a vertex of the first polygon is positioned at the midpoint on each of the sides of the second polygon. Therefore, the plurality of (four here) second points are laid out at equal intervals, and the distance Ls2 (the maximum value of the distance between two adjacent second points) takes the value of the equal interval. The distance Ls2 is 1.0 mm here.

In this embodiment, a triangle defined by a pair of adjacent first points and a near second point is a right angle isosceles triangle of which hypotenuse is defined by the pair of adjacent first points, in which the distance Ls3 is 0.5 mm. Therefore, the values of the distances Ls1, Ls2, Ls3 are all equal to or less than 1.0 mm, or the first distance (L1). The printed circuit board 35 according to this embodiment has all of the first to fourth characteristics described in the first embodiment. It is confirmed, based on a result of calculation using electromagnetic field analysis tool, that the printed circuit board 35 according to this embodiment is preferable for the case where the bit rate of a digital electronic signal transmitted in each channel is any between 50 Gbit/s and 56 Gbit/s. In addition, the total number of the plurality of ground vias is as small as eight, and the area of the second polygon is the smallest, compared to those in other embodiments. That is, it is possible to further reduce the number of ground vias and the area (the second polygon) where the ground vias are formed.

Note that as to the plurality of ground vias according to this embodiment, the distance Ls4 is equal to the distance Ls3, or 0.5 mm. Therefore, whether or not the printed circuit board 35 according to this embodiment has the first to fourth characteristics according to the third embodiment is considered. In this case, the first rectangle is inscribed in the second rectangle. Assuming that the cutoff frequency is 56 GHz, the second distance (L2) is 0.9 mm, and therefore the condition that the distance Ls2 is equal to or shorter than the second distance is not satisfied. Meanwhile, assuming that the cutoff frequency f is 28 GHz, all of the distances Ls1, Ls2, Ls4 are equal to or shorter than the second distance (L2=1.7 mm), and therefore, this condition is satisfied.

Sixth Embodiment

A printed circuit board 36 according to a sixth embodiment of the present invention is similar to the first embodiment except that the layout of the plurality of ground vias is different from the printed circuit board 31 according to the first embodiment. In this embodiment, the distances Ls1, Ls2, Ls3 are all equal to the first distance (L1). Note that the second signal line (the strip conductor 104) and the first signal line (the strip conductor 114) are extending on a single straight line in a plan view.

Figure 17:
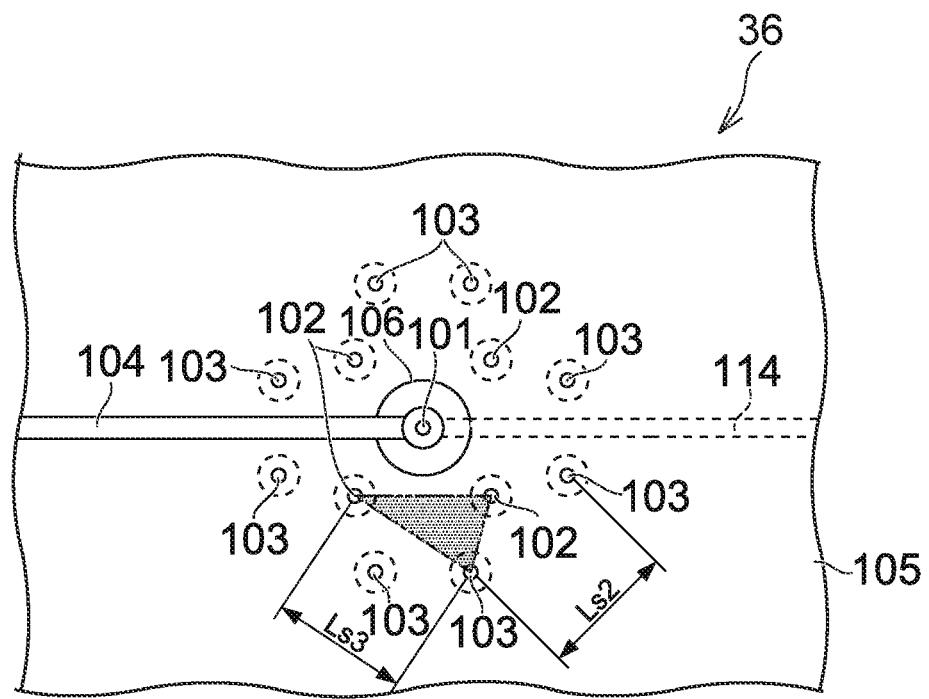
FIG. 17 is a schematic diagram showing a planer surface of a part of a printed circuit board according to a sixth embodiment of the present invention.

FIG. 17 is a schematic diagram showing a planar surface of a part of the printed circuit board 36 according to this embodiment. FIG. 17 corresponds to FIG. 2 according to the first embodiment. The first polygon defined by a plurality of (four here) first points is a square, similar to the first embodiment, and the plurality of (four here) first points are laid out at the respective vertexes of the square. The length of one side of the square (the distance between the centers of the adjacent first ground vias 102) is long, or 1.0 mm. That is, the distance Ls1 is 1.0 mm.

The second polygon defined by a plurality of (eight here) second points is an octagon in which the lengths of the respective sides thereof are alternately 1.0 mm and 0.707 mm. One side of the first polygon (a square) and a shorter side of the second polygon are placed in parallel to each other, and a single line serves as perpendicular bisectors of these sides. The distance Ls2 is 1.0 mm, or the length of a longer side of the octagon. In this embodiment, a triangle including a side having a length equal to the distance Ls3 is the triangle shown shaded in FIG. 17, in which the distance Ls3 is 1.0 mm.

Figure 18:
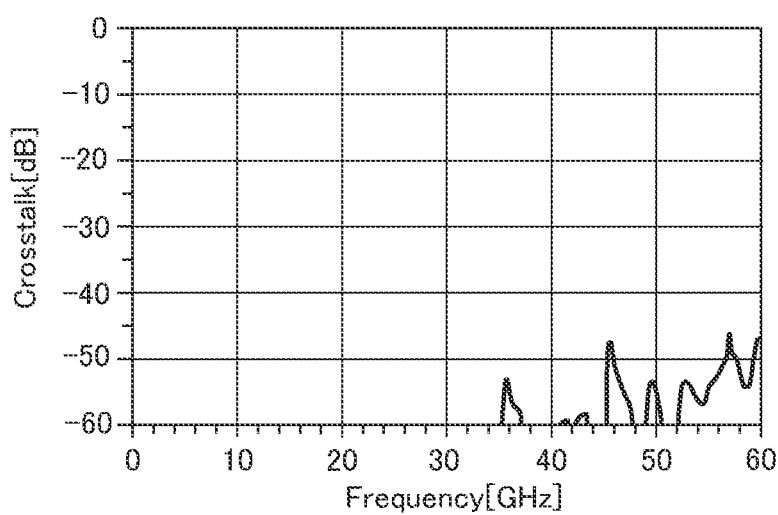
FIG. 18 shows crosstalk characteristic of a signal via formed in a printed circuit board according to the sixth embodiment of the present invention.

FIG. 18 shows crosstalk characteristic of the signal via 101 of the printed circuit board 36 according to this embodiment. The printed circuit board 36 has two channels, similar to FIG. 7, and the distance D1 between the centers of the signal vias 101 in the two respective channels is 9 mm. The distance D2 between the centers of the signal vias 101 in each channel (the length of the strip conductor 114) is 25 mm. The curved line shown in FIG. 18 indicates near-end crosstalk characteristic, indicating −50 dB or less mostly in the frequency range between 0 and 60 GHz, marking −46 dB at the maximum, and −60 dB or less in the frequency range between 0 and 35 GHz. That is, very preferable characteristic can be obtained. The printed circuit board 36 according to this embodiment corresponds to the case in which the distances Ls1, Ls2, Ls3 are all equal to the first distance (L1), and is preferable for the case in which the bit rate of a digital electronic signal transmitted in each channel is any between 50 Gbit/s and 56 Gbit/s.

Seventh Embodiment

A printed circuit board 37 according to a seventh embodiment of the present invention is similar to the first embodiment except that the layout of the plurality of ground vias is different from the printed circuit board 31 according to the first embodiment. The plurality of first points and the plurality of second points according to this embodiment are placed at lattice points of a square lattice. The second signal line (the strip conductor 104) and the first signal line (the strip conductor 114) are extending on a single straight line in a plan view.

Figure 19:
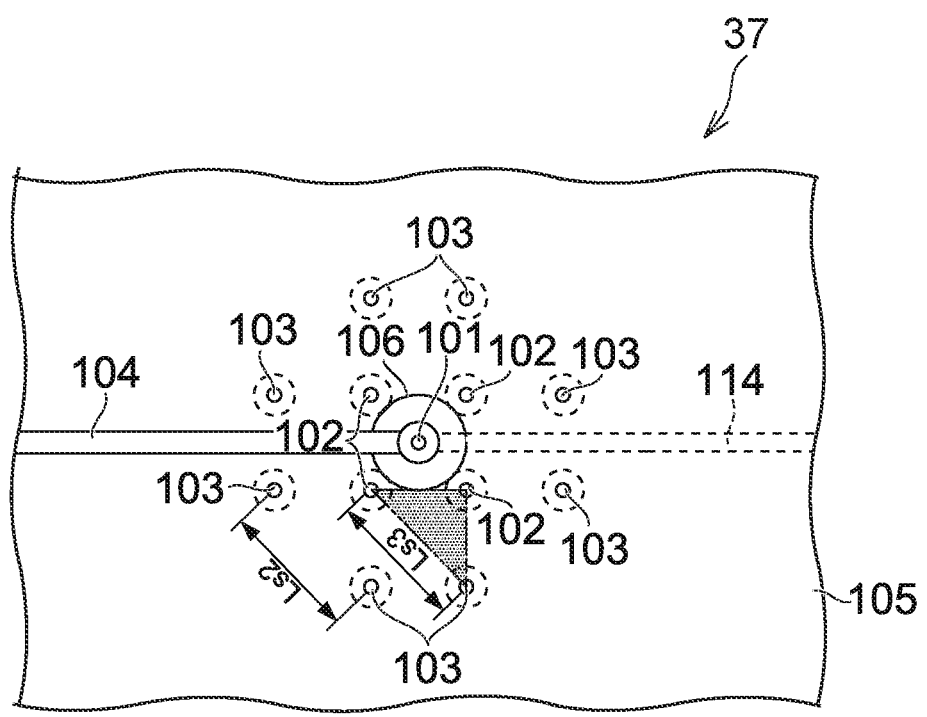
FIG. 19 is a schematic diagram showing a planer surface of a part of a printed circuit board according to a seventh embodiment of the present invention.

FIG. 19 is a schematic diagram showing a planar surface of apart of the printed circuit board 37 according to this embodiment. FIG. 19 corresponds to FIG. 2 according to the first embodiment. The plurality of first ground via 102 (the plurality of first points) and the plurality of second ground vias 103 (the plurality of second points) are arranged in a square lattice with an interval of 0.707 mm. The layout of the plurality of (four here) first ground vias 102 (the plurality of first points) is similar to that in the first embodiment, and the plurality of first points are placed at equal intervals (0.707 mm) to define a square (first polygon).

As shown in FIG. 19, the structure of the plurality of second ground vias 103 (the second ground via group) differs from that of the plurality of second ground vias 103 according to the first embodiment. The second polygon is an octagon, in which the plurality of (eight here) second points are laid out at respective vertexes of the second polygon. That is, the second polygon is an octagon defined by connecting two points placed on each side of a square that defines the outer edge of a 4×4 square lattice. That is, the structure of the plurality of ground vias shown in FIG. 19 corresponds to a structure resulting from removing four second ground vias 103 at four respective corners from the plurality of ground vias (a 4×4 square lattice) according to the third embodiment shown in FIG. 10, although the lattice spacings (the distance Ls1) of the respective square lattices are different.

In this embodiment, the second polygon is congruent with the second polygon according to the sixth embodiment, being an octagon in which the lengths of the respective sides are alternately 1.0 mm and 0.707 mm. The distance Ls2 is 1.0 mm. In this embodiment, a triangle including aside having a length equal to the distance Ls3 is the triangle shown shaded in FIG. 19, and the distance Ls3 is the length of the hypotenuse of a right angle isosceles triangle, or 1.0 mm, that includes two sides together defining a right angle and each having a length equal to the length of a side of the square, or a square lattice spacing (the distance Ls1).

In this embodiment, the values of the distances Ls1, Ls2, Ls3 are all equal to or less than 1.0 mm, or the first distance (L1). The printed circuit board 37 according to this embodiment has all of the first to fourth characteristics described in the first embodiment. It is confirmed, based on a result of calculation using electromagnetic field analysis tool, that the printed circuit board 37 according to this embodiment is preferable for the case where the bit rate of a digital electronic signal transmitted in each channel is any between 50 Gbit/s and 56 Gbit/s.

Note that in the case where the lattice spacing of a square lattice is 0.9 mm, similar to the third embodiment, the distance Ls1=0.9 mm and the distances Ls2=Ls3=1.27 mm are held. This does not satisfy the condition that the distances Ls1, Ls2, Ls3 are all equal to or shorter than 0.1 mm, or the first distance (L1), and therefore is not appropriate for the case where the bit rate of a digital electronic signal is 56 Gbit/s. However, in using for transmission in which the bit rate of a digital modulation signal is 28 Gbit/s, the first distance (L1) is 1.8 mm, and therefore, the above described case in which the via pitch (the distance Ls1) of the plurality of ground vias is 0.9 mm is preferable for the case in which the bit rate of a digital modulation signal transmitted in a channel is 28 Gbit/s.

Eighth Embodiment

A printed circuit board 38 according to an eighth embodiment of the present invention is similar to the first embodiment except that the layout of the plurality of ground vias is different from the printed circuit board 31 according to the first embodiment. The plurality of first points and the plurality of second points according to this embodiment are placed at the lattice points of an equilateral triangular lattice. The second signal line (the strip conductor 104) and the first signal line (the strip conductor 114) are extending on a single straight line in a plan view.

Figure 20:
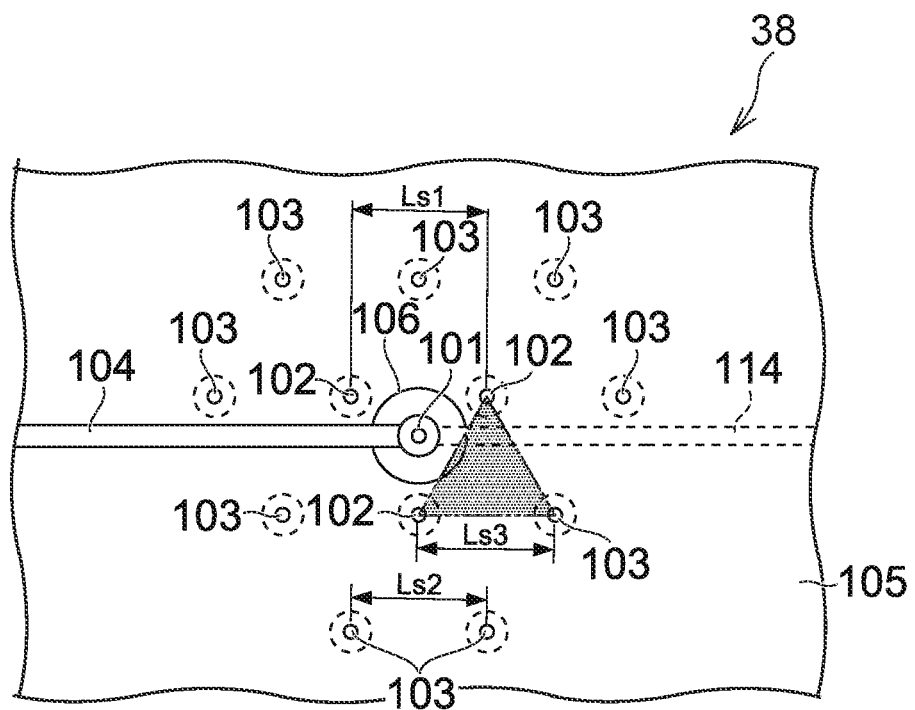
FIG. 20 is a schematic diagram showing a planer surface of a part of a printed circuit board according to an eighth embodiment of the present invention.

FIG. 20 is a schematic diagram showing a planar surface of apart of the printed circuit board 38 according to this embodiment. FIG. 20 corresponds to FIG. 2 according to the first embodiment. The plurality of first points and the plurality of second points are arranged in an equilateral triangular lattice with a lattice spacing of 1.0 mm. The plurality of (three here) first points where a plurality of (three here) ground vias 102 are formed are placed at respective vertexes of the first polygon. The first polygon is an equilateral triangle, and the plurality of first points are laid out at equal intervals (1.0 mm). Therefore, the distance Ls1 is 1.0 mm.

As shown in FIG. 20, a plurality of (nine here) second ground vias 103 are formed at the plurality of (nine here) respective second points. The second polygon is a hexagon, or a shape resulting from removing from each of the three corners of an equilateral triangle, an equilateral triangle with a scale factor ¼. That is, the second polygon is a hexagon in which the lengths of the sides thereof are alternately 2.0 mm and 1.0 mm. The plurality of second points include six second points placed at the respective vertexes of the hexagon and three placed (at midpoints) on the respective longer sides. The plurality of (nine here) second points are laid out at equal intervals, and the distance Ls2 is 1.0 mm. In this embodiment, a triangle including a side having a length equal to the distance Ls3 is the equilateral triangle shown shaded in FIG. 20, and the distance Ls3 is 1.0 mm. Therefore, the values of the distances Ls1, Ls2, Ls3 are all equal to 1.0 mm, or the first distance (L1). The printed circuit board 38 according to this embodiment has all of the first to fourth characteristics described in the first embodiment. It is confirmed, based on a result of calculation using electromagnetic field analysis tool, that the printed circuit board 38 according to this embodiment is preferable for the case where the bit rate of a digital electronic signal transmitted in each channel is any between 50 Gbit/s and 56 Gbit/s. Note that the plurality of first points and the plurality of second points according to this embodiment are placed at respective lattice points of an equilateral triangle lattice, which is a simple structure, and therefore it is possible to readily set a condition so as to satisfy the first to third characteristics according to the first embodiment.

Although the lattice spacing is defined as 1.0 mm in this embodiment, as a case of the lattice spacing being 0.866 mm was verified in an experiment, the lattice spacing may be reduced to at least 0.866 mm. In this case, more preferable crosstalk characteristic can be obtained. Therefore, this is preferable even for the case in which the bit rate of a digital electronic signal transmitted in a channel exceeds 56 Gbit/s. Additionally, it is possible to further reduce the number of the ground vias and an area where the ground vias are formed (the second polygon).

In the above, a printed circuit board, an optical module, and transmission equipment according to embodiments of the present invention have been described. However, the present invention is not limited to the above described embodiments, and can be widely applied to a transmission line structure including a first transmission line. Although the printed circuit board according to the present invention is a printed circuit board mounted on transmission equipment or an optical module, the printed circuit board may be a printed circuit board mounted on other devices. Also, a printed circuit board according to an embodiment of the present invention is preferable for the case where the bit rate of a digital electronic signal transmitted in each channel is any between 50 Gbit/s and 56 Gbit/s (or the case in which the symbol rate is any between 50 Gbaud and 56 Gbaud), in which the first distance is 1.0 mm, and the second distance is 0.9 mm. However, the present invention is applicable even to a case where the bit rate of a digital electronic signal transmitted (or the symbol rate) exceeds 56 Gbit/s (or 56 Gbaud) as well as a case where the bit rate of a digital electronic signal transmitted (or the symbol rate) is slower than 50 Gbit/s (or 50 Gbaud) as long as manufacturing accuracy and sizes of respective components allow.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A printed circuit board, comprising:
a first dielectric layer;
a first signal line extending inside the first dielectric layer;
a first ground conductor layer disposed on a front surface of the first dielectric layer and having a through hole;
a second ground conductor layer disposed on a rear surface of the first dielectric layer;
a second dielectric layer disposed on a side of the first ground conductor layer, opposite from the first signal line;
a second signal line disposed on the side of the first ground conductor layer, opposite from the first signal line at least via the second dielectric layer;
a signal via extending in the through hole, for electrically connecting the first signal line and the second signal line and for being electrically cut off from the first ground conductor layer; and
a plurality of ground vias formed surrounding the signal via and extending through the first dielectric layer, for electrically connecting the first ground conductor layer and the second ground conductor layer,
wherein the plurality of ground vias include a plurality of first ground vias formed at a plurality of respective first points, and a plurality of second ground vias formed at a plurality of respective second points,
wherein the plurality of first points are placed on a line and at least at all respective vertexes of a first polygon in a plan view, the first polygon containing the signal via inside thereof,
wherein the plurality of second points are placed on a line and at least at all respective vertexes of a second polygon in a plan view, the second polygon containing the first polygon on or inside a side thereof, and
wherein when it is assumed that, in a case the plurality of ground vias are arranged in an equilateral triangular lattice, an equilateral triangular lattice spacing with a frequency corresponding to an electronic signal transmitted as a cutoff frequency is defined as a first distance,
distances between the respective adjacent first points among the plurality of first points are all equal to or shorter than the first distance, distances between the respective adjacent second points among the plurality of second points are all equal to or shorter than the first distance, at least one of the plurality of second points is placed within the first distance from each of the adjacent first points making a pair, no via connected to a potential other than a ground potential is formed in an area outside the signal via and inside the second polygon, and no ground via is formed outside the second polygon within the first distance from the second polygon.

2. A printed circuit board, comprising:

a first dielectric layer;

a first signal line extending inside the first dielectric layer;

a first ground conductor layer disposed on a front surface of the first dielectric layer and having a through hole;

a second ground conductor layer disposed on a rear surface of the first dielectric layer;

a second dielectric layer disposed on a side of the first ground conductor layer, opposite from the first signal line;

a second signal line disposed on the side of the first ground conductor layer, opposite from the first signal line at least via the second dielectric layer;

a signal via extending in the through hole, for electrically connecting the first signal line and the second signal line and for being electrically cut off from the first ground conductor layer; and a plurality of ground vias formed surrounding the signal via and extending through the first dielectric layer, for electrically connecting the first ground conductor layer and the second ground conductor layer, wherein the plurality of ground vias include a plurality of first ground vias formed at a plurality of respective first points, and a plurality of second ground vias formed at a plurality of respective second points, wherein the plurality of first points are placed on a line at least at all respective vertexes of a first rectangle in a plan view, the first rectangle containing the signal via inside thereof, wherein the plurality of second points are placed on a line and at least at all respective vertexes of a second rectangle in a plan view, the second rectangle containing the first rectangle on or inside a side thereof, and wherein when it is assumed that, in a case the plurality of ground vias are arranged in a square lattice, an square lattice spacing with a frequency corresponding to an electronic signal transmitted as a cutoff frequency is defined as a second distance, distances between the respective adjacent first points among the plurality of first points are all equal to or shorter than the second distance, distances between the respective adjacent second points among the plurality of second points are all equal to or shorter than the second distance, at least one of the plurality of second points is placed within the second distance from each of the plurality of first points, and no via connected to a potential other than a ground potential is formed in an area outside the signal via and inside the second rectangle, and no ground via is formed outside the second rectangle within the second distance from the second rectangle.

3. The printed circuit board according to claim 1, wherein the plurality of first points and the plurality of second points are placed at respective lattice points of an equilateral triangular lattice.

4. The printed circuit board according to claim 2, wherein the plurality of first points and the plurality of second points are placed at respective lattice points of a square lattice.

5. The printed circuit board according to claim 1, wherein the first polygon is inscribed in the second polygon.

6. The printed circuit board according to claim 2, wherein the first rectangle is inscribed in the second rectangle.

7. The printed circuit board according to claim 1, wherein the first distance is 1.0 mm.

8. The printed circuit board according to claim 2, wherein the second distance is 0.9 mm.

9. The printed circuit board according to claim 1, wherein the first signal line is bent relative to a direction in which the second signal line reaches the signal via so as to avoid the plurality of ground vias in a plan view.

10. The printed circuit board according to claim 1, wherein the first signal line includes a pair of first sub-signal lines, the second signal line includes a pair of second sub-signal lines, and the signal via includes a pair of sub-signal vias, in which one of the pair of sub-signal vias electrically connects one of the pair of first sub-signal lines and one of the pair of second sub-signal lines, and another one of the pair of sub-signal vias electrically connects another one of the pair of first sub-signal lines and another of the pair of second sub-signal lines.

11. The printed circuit board according to claim 1, further comprising a plurality of transmission line structures each including the first signal line, the second signal line, the signal via, and the plurality of ground vias.

12. An optical module, comprising:

the printed circuit board according to claim 1; and an optical device electrically connected to the printed circuit board, for converting one of an optical signal and an electronic signal to another of the optical signal and the electronic signal.

13. A transmission equipment, comprising the printed circuit board according to claim 1.

14. The printed circuit board according to claim 2, wherein the first signal line is bent relative to a direction in which the second signal line reaches the signal via so as to avoid the plurality of ground vias in a plan view.

15. The printed circuit board according to claim 2, wherein the first signal line includes a pair of first sub-signal lines, the second signal line includes a pair of second sub-signal lines, and the signal via includes a pair of sub-signal vias, in which one of the pair of sub-signal vias electrically connects one of the pair of first sub-signal lines and one of the pair of second sub-signal lines, and another one of the pair of sub-signal vias electrically connects another one of the pair of first sub-signal lines and another one of the pair of second sub-signal lines.

16. The printed circuit board according to claim 2, further comprising a plurality of transmission line structures each including the first signal line, the second signal line, and the signal via, the plurality of ground vias.

17. An optical module, comprising:

the printed circuit board according to claim 2; and an optical device electrically connected to the printed circuit board, for converting one of an optical signal and an electronic signal to another of the optical signal and the electronic signal.

18. A transmission equipment, comprising the printed circuit board according to claim 2.

* * * * *